(12) United States Patent
Taniguchi et al.

(10) Patent No.: US 7,056,626 B2
(45) Date of Patent: *Jun. 6, 2006

(54) CRYSTALLIZATION APPARATUS, CRYSTALLIZATION METHOD, THIN FILM TRANSISTOR AND DISPLAY APPARATUS

(75) Inventors: Yukio Taniguchi, Yokohama (JP); Masakiyo Matsumura, Yokohama (JP); Hirotaka Yamaguchi, Yokohama (JP); Mikihiko Nishitani, Yokohama (JP); Susumu Tsujikawa, Yokohama (JP); Yoshinobu Kimura, Yokohama (JP); Masayuki Jyumonji, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 204 days.

This patent is subject to a terminal disclaimer.

(21) Appl. No.: 10/624,555

(22) Filed: Jul. 23, 2003

(65) Prior Publication Data
US 2004/0161676 A1    Aug. 19, 2004

(30) Foreign Application Priority Data
Jul. 24, 2002    (JP) ............................. 2002-215323

(51) Int. Cl.
*G01F 9/00* (2006.01)
(52) U.S. Cl. ........................................................ 430/5
(58) Field of Classification Search .................... 430/5; 117/201; 438/166
See application file for complete search history.

(56) References Cited

U.S. PATENT DOCUMENTS

| | | | |
|---|---|---|---|
| 6,734,635 B1 * | 5/2004 | Kunii et al. ............. | 315/169.3 |
| 6,746,942 B1 * | 6/2004 | Sato et al. ................... | 438/586 |
| 2002/0104750 A1 | 8/2002 | Ito | |
| 2003/0099264 A1 | 5/2003 | Dantus et al. | |
| 2003/0231663 A1 | 12/2003 | Ohtsuki et al. | |
| 2004/0005744 A1 | 1/2004 | Taniguchi et al. | |

(Continued)

FOREIGN PATENT DOCUMENTS

JP    2000-306859    11/2000

OTHER PUBLICATIONS

Wen-Chang Yeh, et al., "Effects of a Low-Melting-Point Underlayer on Excimer-Laser-Induced Lateral Crystallization of Si Thin-Films", Jpn. J. Appl. Phys., vol. 40, No. 5A, May 2001, pp. 3096-3100.

(Continued)

*Primary Examiner*—S. Rosasco
(74) *Attorney, Agent, or Firm*—Oblon, Spivak, McClelland, Maier & Neustadt, P.C.

(57) ABSTRACT

The present invention is directed to a crystallization apparatus including an illumination system to illuminate a phase shift mask, which converts a light beam from the illumination system into a light beam that has a light intensity distribution of an inverse peak pattern having a minimum intensity in an area corresponding to a phase shift portion of the phase shift mask. The crystallization apparatus further includes an optical member to form on a predetermined plane a light intensity distribution of a concave pattern, which has a light intensity that is minimum in an area corresponding to the phase shift portion and increases toward the circumference of that area based on the light from the illumination system, and an image-forming optical system to set a surface of the polycrystalline semiconductor film or the amorphous semiconductor film or its conjugate plane and the predetermined plane to an optical conjugate relationship.

31 Claims, 15 Drawing Sheets

U.S. PATENT DOCUMENTS

| | | |
|---|---|---|
| 2004/0036969 A1 | 2/2004 | Taniguchi et al. |
| 2004/0061149 A1 | 4/2004 | Jyumonji et al. |
| 2004/0126674 A1 | 7/2004 | Taniguchi et al. |
| 2004/0142544 A1 | 7/2004 | Kimura et al. |
| 2004/0161913 A1 | 8/2004 | Kawasaki et al. |
| 2004/0266080 A1 | 12/2004 | Jyumonji et al. |

OTHER PUBLICATIONS

Y. Sano, et al., "Highly Packed and Ultra-Large Si Grains Grown by a Single-Shot Irradiation of Excimer-Laser Light Pulse", Department of Physical Electronics, Tokyo Institute of Technology, 8 pages.

Masakiyo Matsumura, "Preparation of Ultra-Large Grain Silicon Thin-Films by Excimer-Laser", Surface Science, vol. 21, No. 5, pp. 278-287, 2000, (pp. 34-43).

M. Nakata, et al., "Two-Dimensionally Position-Controlled Ultra-Large Grain Growth Based on Phase-Modulated Excimer-Laser Annealing Method", Department of Physical Electronics, Tokyo Institute of Technology, Eletrochemical Society Proceedings vol. 2000-31, (-5- pgs).

W. Yeh, et al., Jpn. J. Appl. Phys., vol. 41, Part 1, No. 4A, pp. 1909-1914, "Proposed Sample Structure for Marked Enlargement of Excimer-Laser-Induced Lateral Grain Growth in Si Thin Films", Apr. 2002.

M. Nakata, et al., Jpn. J. Appl. Phys., vol. 40, Part 1, No. 5A, pp. 3049-3054, "A New Nucleation-Site-Control Excimer-Laser-Crystalization Method", May 2001.

C-H. Oh, et al., Jpn. J. Appl. Phys., vol. 37, Part 2, No. 5A, pp. L492-L495, "A Novel Phase-Modulated Excimer-Laser Crystalization Method of Silicon Thin Films", May 1, 1998.

M. Matsumura, et al., Thin Solid Films, vol. 337, pp. 123-128, "Advanced Excimer-Laser Annealing Process for Quasi Single-Crystal Silicon Thin-Film Devices", 1999.

M. Matsumura, Applied Physics, vol. 71, No. 5, pp. 543-547, "Excimer-Laser-Grown Silicon Thin Films With Ultralarge Grains", 2002.

* cited by examiner

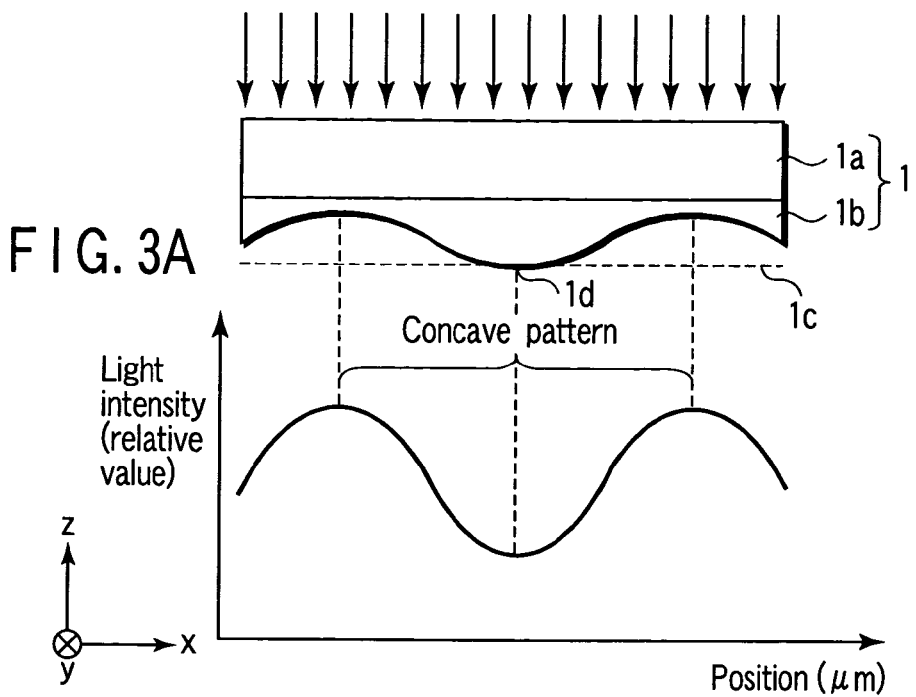
FIG. 3A
FIG. 3B
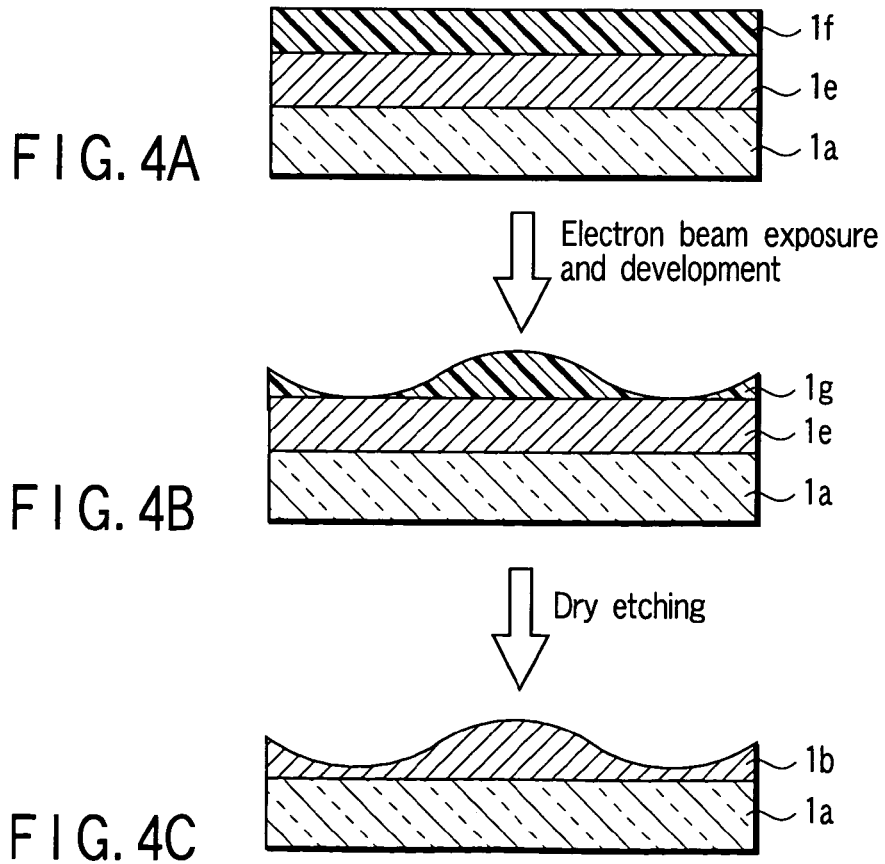
FIG. 4A
Electron beam exposure and development
FIG. 4B
Dry etching
FIG. 4C

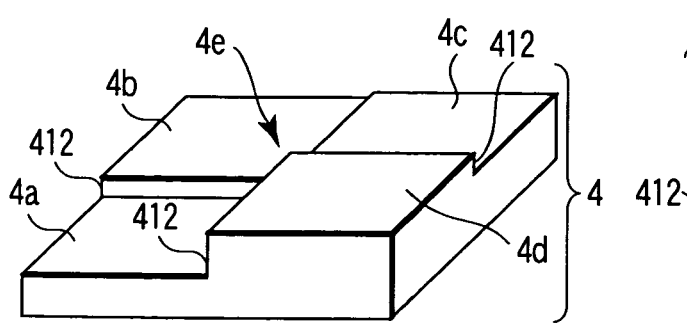
FIG. 5A
FIG. 5B
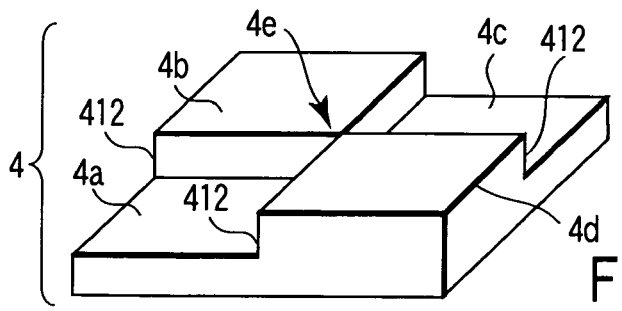
FIG. 5C
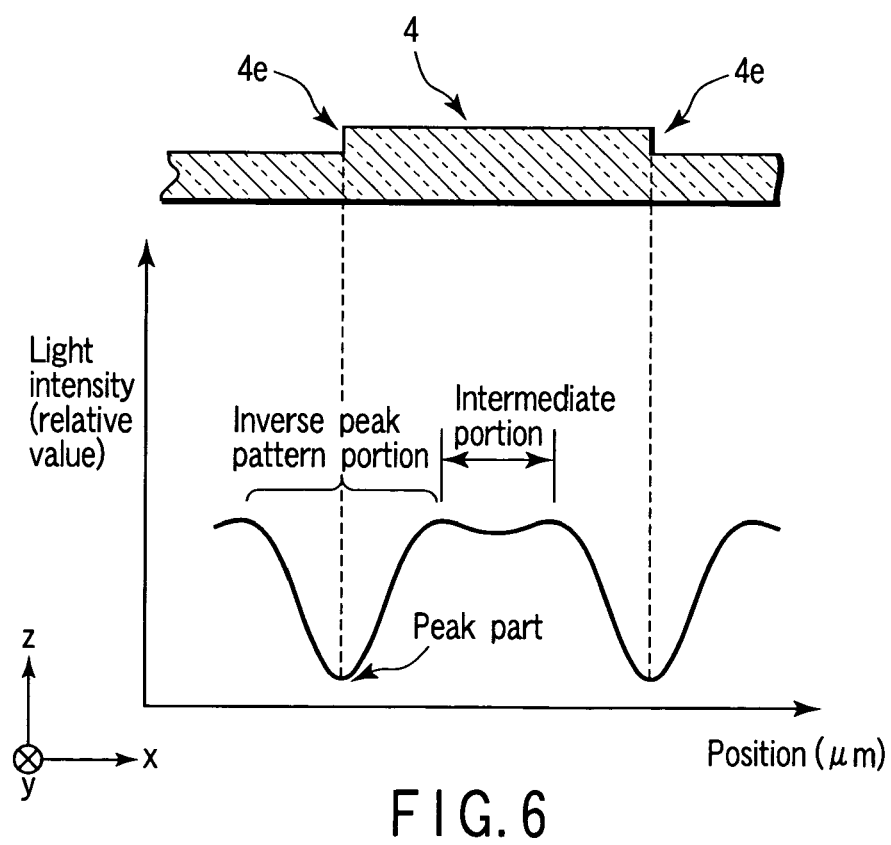
FIG. 6

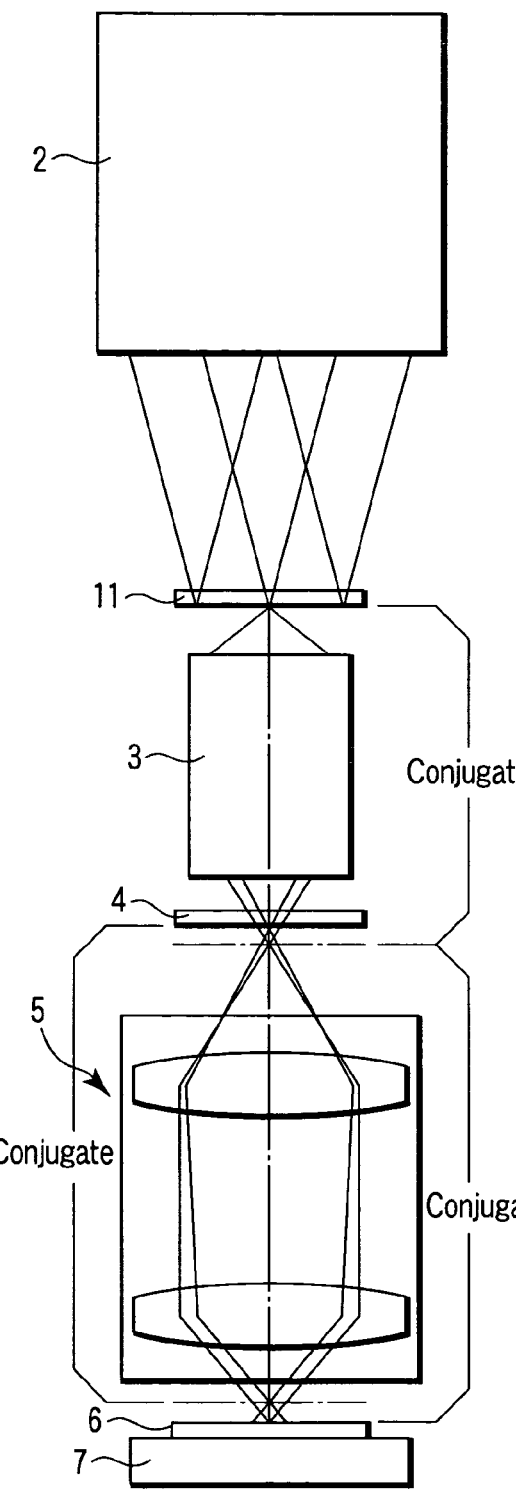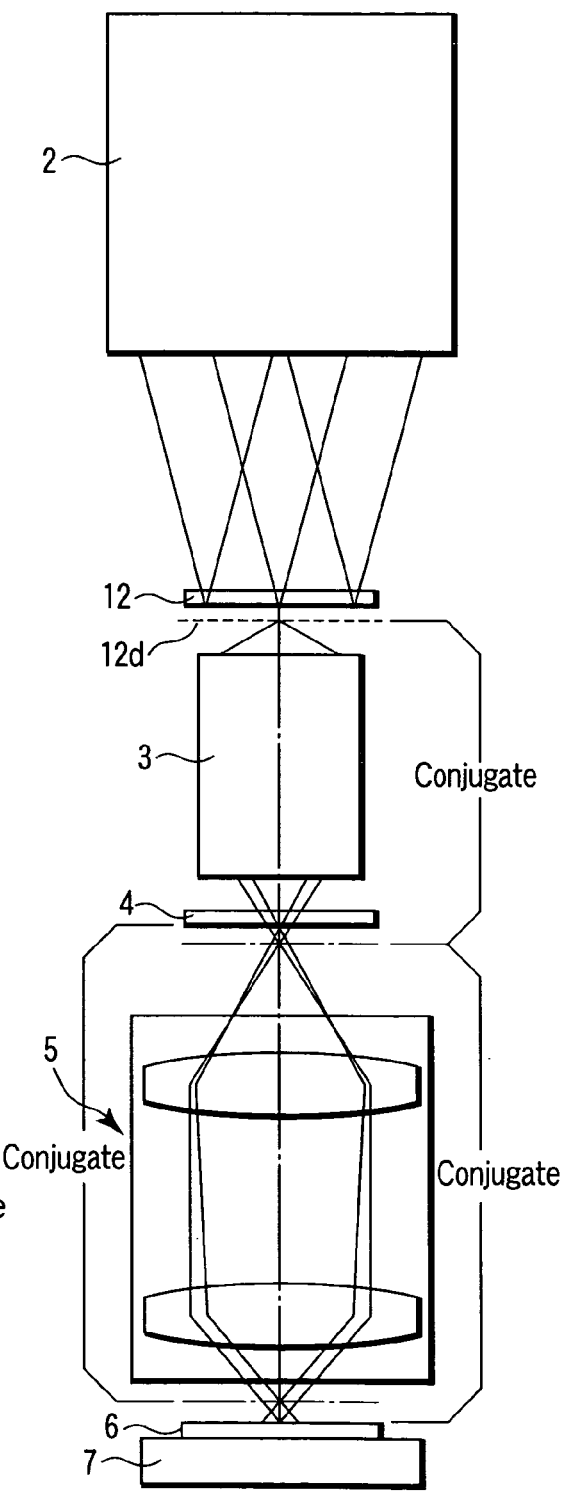
FIG. 9                    FIG. 11

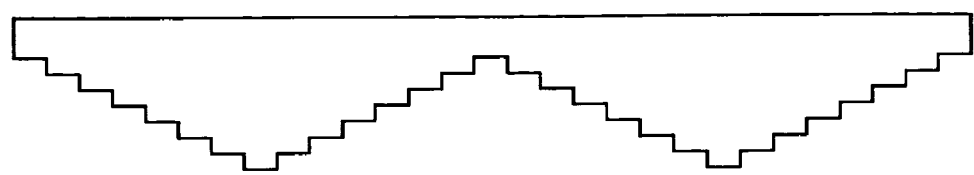
F I G. 13A
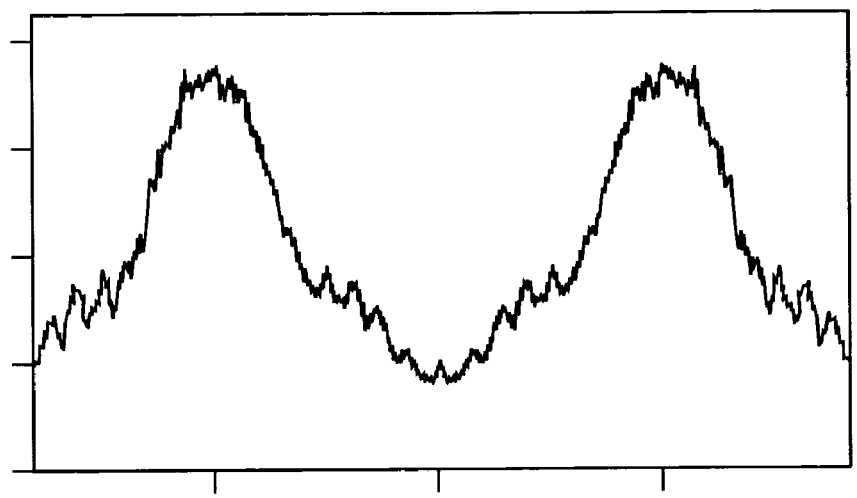
F I G. 13B
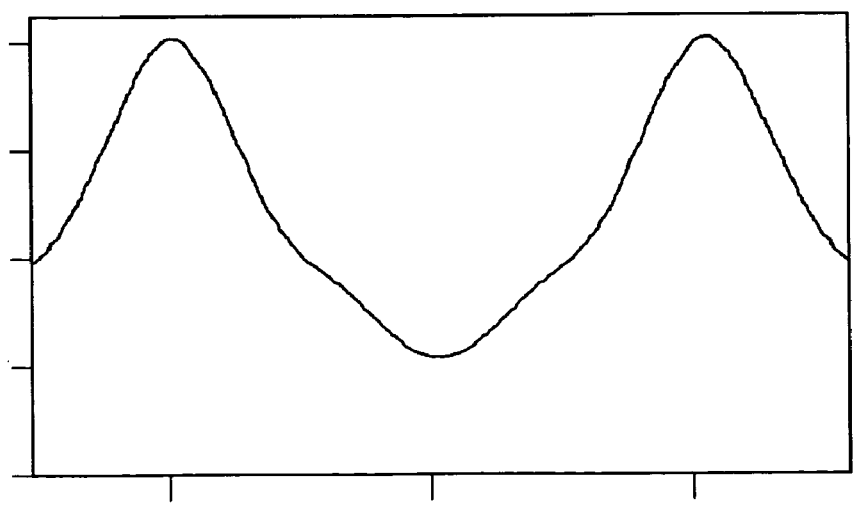
F I G. 13C

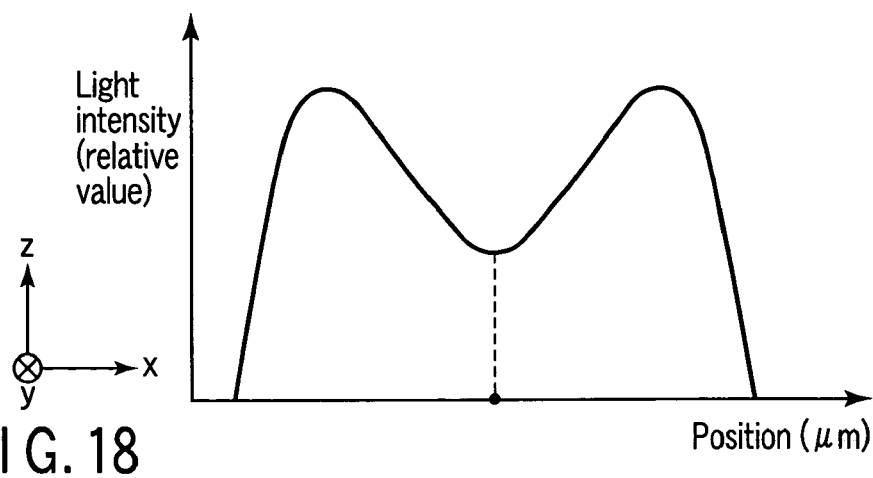
F I G. 18
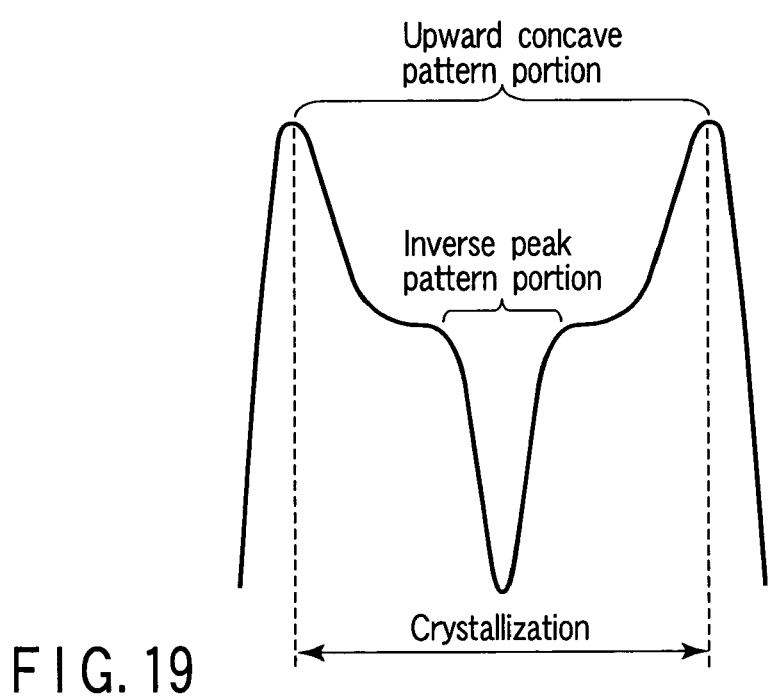
F I G. 19
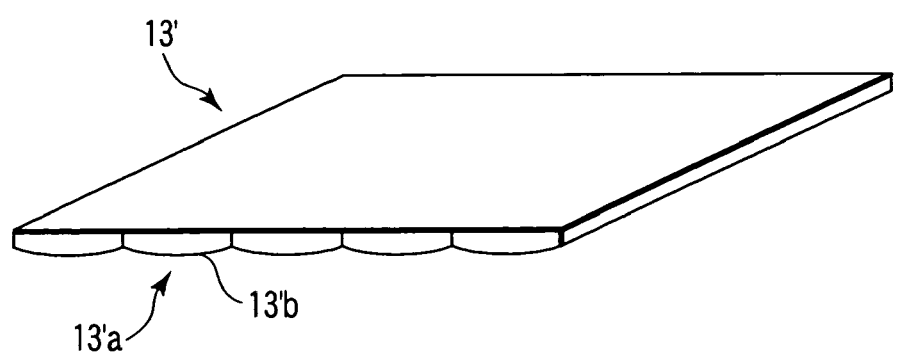
F I G. 21

CRYSTALLIZATION APPARATUS, CRYSTALLIZATION METHOD, THIN FILM TRANSISTOR AND DISPLAY APPARATUS

CROSS-REFERENCE TO RELATED APPLICATIONS

This application is based upon and claims the benefit of priority from the prior Japanese Patent Application No. 2002-215323, filed Jul. 24, 2002, the entire contents of which are incorporated herein by reference.

BACKGROUND OF THE INVENTION

1. Field of the Invention

The present invention relates to a crystallization apparatus and a crystallization method which produce a crystallized semiconductor film by irradiating an uncrystallized semiconductor film such as a polycrystalline semiconductor film or an amorphous semiconductor film with radiant energy such as a laser beam. More particularly, the present invention relates to a crystallization apparatus and a crystallization method which produce a crystallized semiconductor film by irradiating an uncrystallized semiconductor film with a laser beam phase-modulated by using a phase shift mask.

2. Description of the Related Art

Materials of a thin film transistor (TFT) for use in a switching element or the like which controls a voltage to be applied to pixels of, e.g., a liquid crystal display (LCD) are conventionally roughly classified into amorphous silicon, polycrystalline silicon and monocrystalline silicon.

Polycrystalline silicon has a higher mobility of electrons or electron holes than the amorphous silicon. Therefore, when a transistor is formed by using polycrystalline silicon, since the switching speed is higher than that in the case of using amorphous silicon, there is an advantage that the response of a display becomes fast and the design margin of any other component can be reduced. Further, when peripheral circuits such as a driver circuit formed at a part other than a display main body or a DAC which converts a digital signal into an analog signal are formed within a display area, using the amorphous silicon enables high-speed operation of these peripheral circuits.

Although polycrystalline silicon comprises a set of crystallized grains, it has a lower mobility of electrons or electron holes than monocrystalline silicon. Furthermore, in a small transistor formed by using the amorphous silicon, there is a problem of irregularities in crystal grain boundary number at a channel portion. Thus, in recent years, in order to improve the mobility of electrons and electron holes and reduce irregularities in crystal grain boundary number at a channel portion (activation portion) of each TFT, many crystallization methods which produce crystal grains with a larger particle size have been proposed.

As this type of crystallization method, there has been conventionally known phase control ELA (Excimer Laser Annealing), which produces a crystallized semiconductor film by irradiating a polycrystalline semiconductor film or an amorphous semiconductor film with an excimer laser beam through a phase shift mask. The details of phase control ELA are disclosed in, e.g., "Surface Science Vol. 21, No. 5, pp. 278–487, 2000" or Jpn. Pat. Appln. KOKAI Publication No. 2000-306859 ([0030] to [0034], FIGS. 8 to 11).

In phase control ELA, the phase shift mask is used to generate a light intensity distribution of an inverse peak pattern (light intensity distribution where the light intensity is rapidly increased with distance from the position where the light intensity is minimum), and an uncrystallized semiconductor film such as a polycrystalline semiconductor film or an amorphous semiconductor film is irradiated with a light beam cyclically having this light intensity distribution of the inverse peak pattern. As a result, a fusion area is generated in the irradiated uncrystallized semiconductor film in accordance with the light intensity distribution, a crystal nucleus is formed at a part which is not fused or a part which first solidifies in accordance with the position where the light intensity is minimum, and the crystal grows in a lateral direction (lateral growth) from the crystal nuclei toward the circumference, thereby generating crystal grains (monocrystalline) with a large particle size.

As described above, in the prior art, since the semiconductor film is irradiated with a light beam that has the light intensity distribution of the inverse peak pattern and the crystal nuclei is formed at a part corresponding to a position where the light intensity is minimum in the light intensity distribution, the crystal nuclei formation position can be controlled.

However, the phase shift mask cannot control the light intensity distribution at an intermediate portion between two adjacent inverse peak pattern portions.

Actually, in the prior art, the light intensity distribution at the intermediate part generally involves irregular surges (undulance distribution such that an increase and a decrease in the light intensity are repeated). In this case, in a crystallization process, there is a disadvantage that the lateral growth, which has started from the crystal nucleus, stops at the intermediate portion where the light intensity decreases, so that growth of a large crystal is interrupted. Furthermore, even if a substantially uniform light intensity distribution is obtained at the intermediate portion, there is a drawback that the lateral growth is stopped at an arbitrary position in this uniform light intensity distribution and growth of a large crystal is interrupted.

BRIEF SUMMARY OF THE INVENTION

In view of the above-described problems, it is an object of the present invention to provide a crystallization apparatus, which can realize sufficient lateral growth from a crystal nucleus and produce a crystallized semiconductor film with a large particle size, a crystallization method, a thin film transistor and a display apparatus.

To solve the above-described problems, according to a first invention of the present invention, there is provided a crystallization apparatus, which includes an illumination system that illuminates a phase shift mask to irradiate a polycrystalline semiconductor film or an amorphous semiconductor film with a light beam that has a light intensity distribution of an inverse peak pattern that has a minimum light intensity in an area corresponding to a phase shift portion of the phase shift mask to produce a crystallized semiconductor film, comprising an optical member to form on a predetermined plane a light intensity distribution of a concave pattern, which has a light intensity that is minimum in an area corresponding to the phase shift portion and increases toward a circumference of that area based on the light from the illumination system; and an image-forming optical system to set a surface of the polycrystalline semiconductor film or the amorphous semiconductor film or its conjugate plane and the predetermined plane to an optical conjugate relationship.

According to a preferred aspect of the first invention, the optical member has a transmission type amplitude modulation mask having a transmittance distribution according to the light intensity distribution having the concave pattern to be formed on the predetermined plane. It is preferable that the transmission type amplitude modulation mask has a light transmission portion having a fixed thickness, and a light absorption portion having a thickness distribution according to the light intensity distribution having the concave pattern to be formed on the predetermined plane. Moreover, preferably, the light absorption portion has a sinusoidal surface. It is preferable that the sinusoidal surface is formed into a continuously curved shape or a step-like shape.

Additionally, according to a preferred aspect of the first invention, the optical member is an open type amplitude modulation mask having a numerical aperture distribution according to the light intensity distribution having the concave pattern to be formed on the predetermined plane. It is preferable that the open type amplitude modulation mask has many minute transmission areas or many minute light shielding areas or both. Further, preferably, sizes of the minute transmission area and the minute light shielding area are set to be substantially smaller than the resolution of the image-forming optical system. Furthermore, it is preferable that the image-forming optical system is a reduction optical system.

Furthermore, according to a preferred mode of the first invention, on the predetermined plane, the optical member is a converging/diverging element which produces an area which is illuminated when a light beam is diverged in accordance with the phase shift portion and an area which is illuminated when a light beam is converged in accordance with the circumference of the phase shift portion. It is preferable that the converging/diverging element has a diverging refraction surface to diverge a light beam and a converging refraction surface to converge a light beam. Further, it is preferable that the diverging refraction surface and the converging refraction surface form a sinusoidal refraction surface. Moreover, it is preferable that the sinusoidal refraction surface is formed into a continuous curved shape or a step-like shape.

Additionally, according to a preferred mode of the first invention, the optical member has a light intensity distribution formation element to form a predetermined light intensity distribution having a light intensity that is larger at a circumference rather than a center on a pupil plane of the illumination system or in the vicinity thereof, and a wavefront splitting element to wavefront-split a light beam supplied from the illumination system into a plurality of light beams and converge each wavefront-split light beam in an area corresponding to the phase shift portion on the predetermined plane. It is preferable that the wavefront splitting element has a plurality of optical elements having a converging function. It is preferable that the predetermined light intensity distribution has a circular central area, where a relatively small light intensity, and a toric peripheral area, which is formed so as to surround the central area and has a relatively large light intensity. Further, it is preferable that the predetermined light intensity distribution has a central area, which is elongated along a predetermined direction and has a relatively small light intensity, and a peripheral area, which is formed so as to surround or sandwich the central area and has a relatively large light intensity. Furthermore, it is preferable that the light intensity distribution formation element has a transmission filter having a predetermined light transmittance distribution, which is arranged on the illumination pupil plane or in the vicinity thereof.

Moreover, according to a preferred mode of the first invention, it is preferable that a phase shift surface of the phase shift mask is formed on a surface on a side opposite to the illumination system side. It is preferable that the light intensity distribution that is applied to the polycrystalline semiconductor film or the amorphous semiconductor film has an inverse peak pattern area that has a minimum light intensity in an area corresponding to the phase shift portion of the phase shift mask, and a concave pattern area, which has the light intensity increases from the inverse peak pattern area toward the circumference, and has an inflection point where an inclination decreases toward the circumference between the inverse peak pattern area and the concave pattern area.

Additionally, according to a preferred mode of the first invention, the polycrystalline semiconductor film or the amorphous semiconductor film and the phase shift mask are arranged parallel to each other and in close proximity to each other. It is preferable that the apparatus further comprises a second image-forming optical system arranged in a light path between the polycrystalline semiconductor film or the amorphous semiconductor film and the phase shift mask, wherein a surface of the polycrystalline semiconductor film or the amorphous semiconductor film is set apart from a plane which is optically conjugate with the phase shift mask through the second image-forming optical system along an optical axis by a predetermined distance. It is preferable that the apparatus further comprises a second image-forming optical system arranged in a light path between the polycrystalline semiconductor film or the amorphous semiconductor film and the phase shift mask, wherein a surface of the polycrystalline semiconductor film or the amorphous semiconductor film is set to a plane optically conjugate with the phase shift mask through the second image-forming optical system, and an image side numerical aperture of the second image-forming optical system is set to a value required to generate the light intensity distribution having the inverse peak pattern.

According to a preferred aspect of the second invention, there is provided a crystallization method, which illuminates a phase shift mask to irradiate a polycrystalline semiconductor film or an amorphous semiconductor film with a light beam that has a light intensity distribution of an inverse peak pattern, which has a light intensity that is minimum in an area corresponding to a phase shift portion of the phase shift mask to produce a crystallized semiconductor film, comprises forming on a predetermined plane a light intensity distribution having a concave pattern that a light intensity becomes minimum in an area corresponding to the phase shift portion and the light intensity increases toward the circumference of that area based on the light from the illumination system; and setting a surface of the polycrystalline semi-conductor film or the amorphous semiconductor film or its conjugate plane and the predetermined plane to an optically conjugate relationship through the image-forming optical system.

Additionally, according to a preferred aspect of the second invention, there is provided a the polycrystalline semiconductor film or the amorphous semiconductor film and the phase shift mask are arranged parallel to each other and in close proximity to each other. It is preferable that a second image-forming optical system is arranged in a light path between the polycrystalline semiconductor film or the amorphous semiconductor film and the phase shift mask, and a surface of the polycrystalline semiconductor film or the amorphous semiconductor film is set apart from a plane that is optically conjugate with the phase shift mask along an optical axis by a predetermined distance. Further, preferably, a second image-forming optical system is arranged in a light path between the polycrystalline semiconductor film or the amorphous semiconductor film and the phase shift mask, an image side numerical aperture of the second image-forming optical system is set to a value required to generate the light intensity distribution having the inverse peak pattern, and the surface of the polycrystalline semiconductor film or the amorphous semiconductor film is set to a plane which is optically conjugate with the phase shift mask through the second image-forming optical system.

According to a preferred aspect of the third invention, there is provided a thin film transistor manufactured by the crystallization method according to the afore mentioned crystallization method.

According to a preferred aspect of the forth invention, there is provided a display apparatus including the thin film transistor according to the afore mentioned thin film transistor.

Advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are views illustrating a structure and an effect of a transmission type amplitude modulation mask according to the first embodiment;

FIGS. 4A to 4C are views showing manufacturing steps of the transmission type amplitude modulation mask according to the first embodiment;

FIG. 5A is a view showing a structure of a basic unit part of a phase shift mask in the perspective manner;

FIG. 5B is a top view showing an arrangement of the basic unit parts of the phase shift mask depicted in FIG. 5A;

FIG. 5C is a view showing a structure of another basic unit part of the phase shift mask in the perspective manner;

FIG. 6 is a view illustrating a basic effect of the phase shift mask in the first embodiment;

FIG. 9 is a view schematically showing a crystallization apparatus according to a first modification of the first embodiment;

FIG. 11 is a view schematically showing a crystallization apparatus according to a second modification of the first embodiment;

FIG. 13A is a view showing a converging/diverging element having a step-shaped refraction surface;

FIG. 13B is a view showing a simulation result concerning an upward concave light intensity distribution of a light beam obtained on a phase shift mask;

FIG. 13C is a view showing a light intensity distribution when a resolution of a first image-forming optical system is set lower to some extent;

FIG. 18 is a view illustrating a light intensity distribution of a light beam on a rear side focal plane obtained by effects of both the transmission filter and the micro lens array;

FIG. 19 is a view showing a light intensity distribution obtained on a substrate to be processed by a cooperative effect of the transmission filter, the micro lens array and the phase shift mask;

FIG. 21 is a view showing a micro cylindrical lens array according to a third modification;

DETAILED DESCRIPTION OF THE INVENTION

Embodiments according to the present invention will now be described based on the accompanying drawings.

Figure 1:
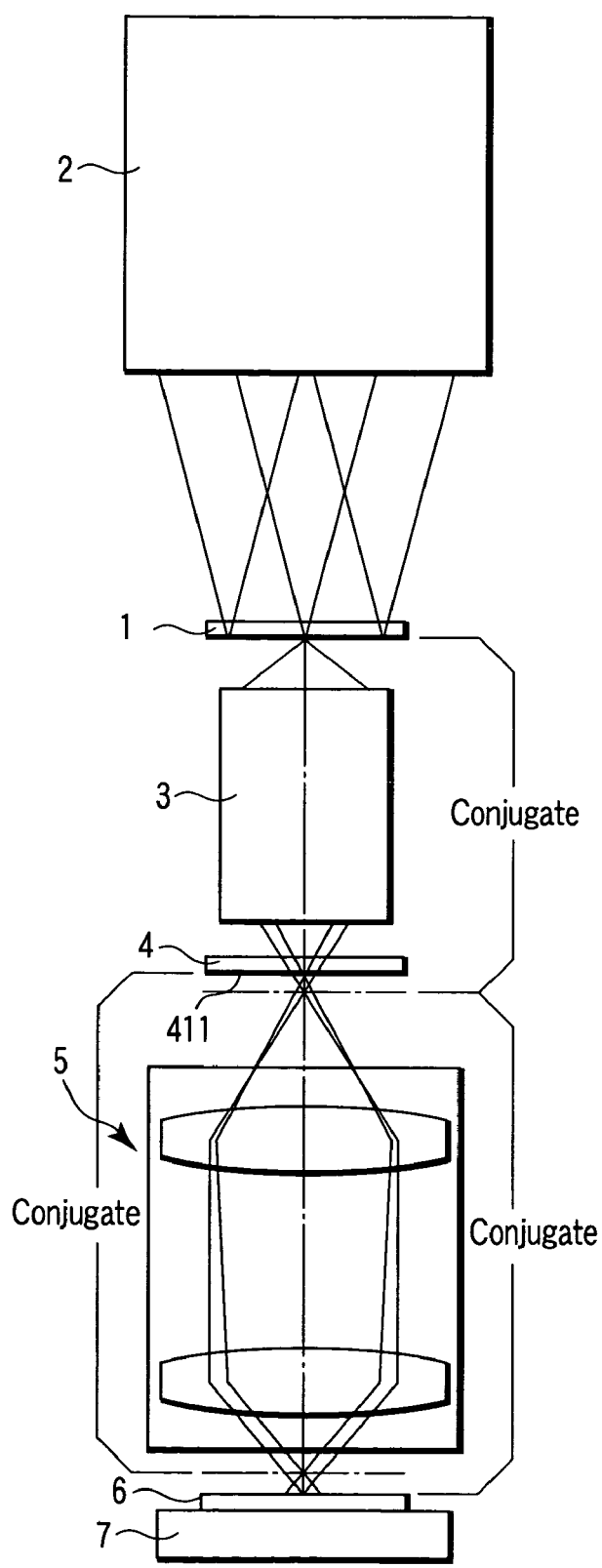
FIG. 1 is a view schematically showing a structure of a crystallization apparatus according to a first embodiment of the present invention.

FIG. 1 is a view schematically showing a structure of a crystallization apparatus according to a first embodiment of the present invention. As shown in FIG. 1, the crystallization apparatus according to the first embodiment has: an illumination optical system 2 which illuminates a predetermined area of a substrate 6 to be processed; a transmission type amplitude modulation mask 1 positioned on a light path between the substrate 6 and the illumination optical system 2; a phase shifter, i.e., a phase shift mask 4 positioned on a light path between this transmission type amplitude modulation mask 1 and the substrate 6; a first image-forming optical system 3 arranged on a light path between the transmission type amplitude modulation mask 1 and the phase shift mask 4; and a second image-forming optical system 5 arranged on a light path between the phase shift mask 4 and the substrate 6. The illumination optical system 2 projects the illumination light to the transmission type amplitude modulation mask 1.

A surface of the substrate 6 is positioned so as to have an optically conjugate relationship with an exit surface of the transmission type amplitude modulation mask 1 through the first image-forming optical system 3 and the second image-forming optical system 5. Further, a surface of the substrate 6 is distanced along an optical axis from a plane (image plane of the second image-forming optical system 5) which is optically conjugate with a phase shift surface 411 (surface on the lower side in FIG. 1) of the phase shift mask 4. The first image-forming optical system 3 and the second image-forming optical system 5 may be of either an inflection type optical system or a reflection type optical system.

In the first embodiment, the substrate 6 can be obtained by forming an underlying film and an amorphous silicon film on, e.g., a liquid crystal display flat glass by a chemical vapor deposition method. The substrate 6 is held at a predetermined position on a substrate stage 7 by using, e.g., a vacuum chuck or an electrostatic chuck.

Figure 2:
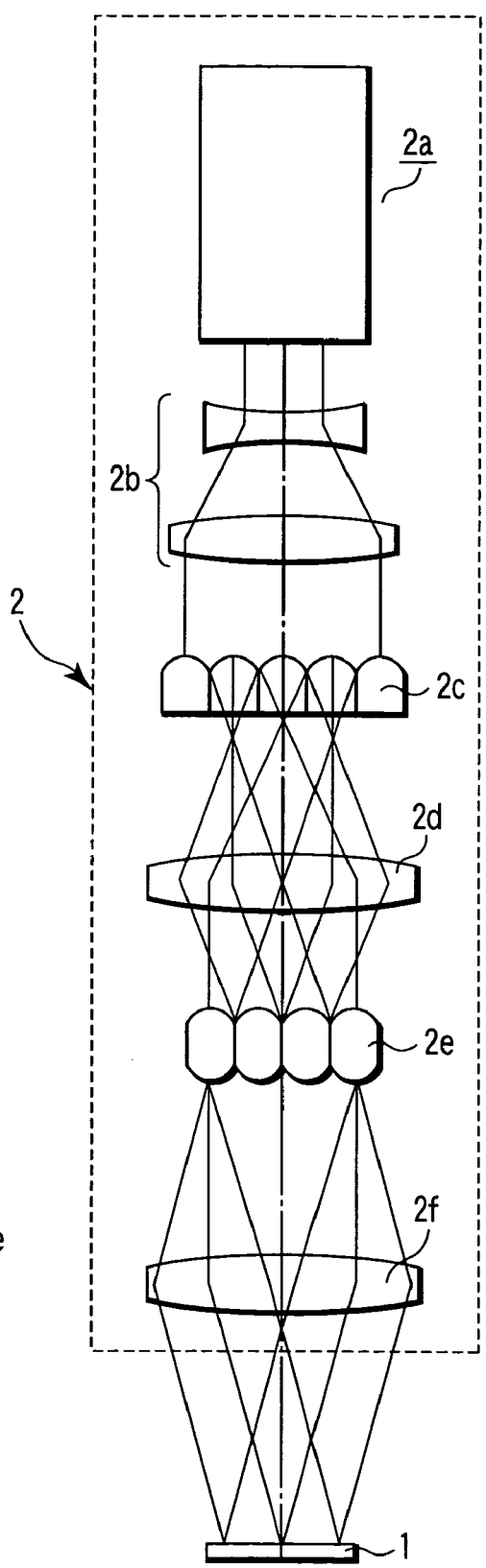
FIG. 2 is a view schematically showing an internal structure of an illumination optical system illustrated in FIG. 1.

FIG. 2 is a view schematically showing an internal structure of the illumination optical system depicted in FIG. 1. As shown in FIG. 2, the illumination optical system 2 includes: a light source 2a such as a KrF excimer laser, which supplies a beam of light having a wavelength of 248 nm, for example; a beam expander 2b, which enlarges a laser beam from the light source 2a; first and second fly-eye lenses 2c and 2e comprising a plurality of convex lenses arranged on a flat plane; and first and second condenser optical systems 2d and 2f. It is to be noted that any other appropriate light source such as an XeCl excimer laser can be used as the light source 2a.

As schematically shown in FIG. 2, the light beam emitted from the light source 2a is enlarged through a beam expander 2b and enters the first fly-eye lens 2c. Since the light beam which has entered the first fly-eye lens 2c undergoes a converging effect by each convex lens of the first fly-eye lens 2c, a plurality of point light sources are substantially formed on a rear side focal plane of the first fly-eye lens 2c. The light beams from a plurality of these point light sources illuminate an entrance surface of the second fly-eye lens 2e through the first condenser optical system 2d in the overlapping manner.

Since the light beams which have entered the second fly-eye lens 2e from a plurality of the point light sources undergo the converging effect by each convex lens of the second fly-eye lens 2e, more point light sources than those on the rear side focal plane of the first fly-eye lens 2c are formed on a rear side focal plane of the second fly-eye lens 2e. The light beams from a plurality of the point light sources formed on the rear side focal plane of the second fly-eye lens 2e further enter the second condenser optical system 2f.

The first fly-eye lens 2c and the first condenser optical system 2d constitute a first homogenizer, and uniformize an incident angle on the transmission type amplitude modulation mask 1. Likewise, the second fly-eye lens 2e and the second capacitor optical system 2f constitute the second homogenizer, and uniformize an in-plane position on the transmission type amplitude modulation mask 1. Therefore, the illumination optical system 2 projects the light beams having the substantially uniform light intensity distributions in the overlapping manner. In this way, the illumination optical system 2 projects the light beam that has the uniform light intensity distribution. This light beam illuminates an entrance surface of the transmission type amplitude modulation mask 1.

FIGS. 3A and 3B are views illustrating a structure and an effect of the transmission type amplitude modulation mask 1 according to the first embodiment. Furthermore, FIGS. 4A to 4C are views showing manufacturing steps of the transmission type amplitude modulation mask 1 according to the first embodiment. Although FIGS. 3A and 3B and FIGS. 4A to 4C show only a basic unit part of the transmission type amplitude modulation mask 1 for clarifying the drawings, the basic unit parts are actually one-dimensionally aligned and arranged in the transmission type amplitude modulation mask 1 along a direction (x direction) of a transmittance distribution.

As shown in FIG. 3A, the transmission type amplitude modulation mask 1 has a vertical plate-type light transmission portion 1a having a fixed thickness and a light absorption portion 1b having a thickness which varies in a sinusoidal form as a whole, and the light transmission portion 1a and the light absorption portion 1b are integrally formed, for example. A light absorption material (light shielding material) forming the light absorption portion 1b is a material used in, e.g., a halftone type phase shift mask, i.e., MoSi, MoSiON, ZrSiO, a-Carbon, SiN/iN, TiSiN or Sr. As shown in FIG. 3B, the transmission type amplitude modulation mask 1 modulates a light intensity of a laser beam that has a uniform light intensity distribution from the illumination optical system 2.

An example of the manufacturing steps of the transmission type amplitude modulation mask 1 will now be described with reference to FIGS. 4A to 4C. First, as shown in FIG. 4A, for example, a light absorption film 1e comprising ZrSiO is evenly formed on the light transmission portion 1a formed of quartz glass, and a resist 1f is then applied on a surface of the light absorption film 1e. Then, a quantity of dose is continuously changed, and electron beam plotting and developing processing are applied so that a resist film 1g having a continuous cross-sectional sinusoidal curved shape as shown in FIG. 4B is formed. Then, with this resist film 1g being used as a mask, etching the light absorption film 1e by using a dry etching technique forms such a transmission type amplitude modulation mask 1 as shown in FIG. 4C which includes the light absorption portion 1b having a continuous curved surface. In the manufacturing steps of the mask 1, the transmission type amplitude modulation mask 1 which includes the light absorption portion 1b having a step-shaped surface (e.g., a surface approximated by an eight-level step) may be formed by, e.g., repeating formation of the light absorption film 1e and patterning for a number of multiple times. This transmission type amplitude modulation mask generates the transmission light having a sinusoidal light intensity distribution.

FIG. 5A is a view schematically showing a structural example of the basic unit part of the phase shift mask 4. As shown in FIG. 5A, the basic unit part of the phase shift mask 4 has a phase shift surface including four rectangular first to fourth areas 4a to 4d having different thicknesses, a pair of the first area 4a and the third area 4c and a pair of the second area 4b and the fourth area 4d are respectively provided at opposing corners. The two rectangular areas 4a–4c or 4b–4d positioned at the opposing corners supply a phase difference between, e.g., the transmitted light beams. That is, the phase shift mask 4 has a step-like shape that the first to fourth areas 4a to 4d gradually become thick. Steps of the respective areas 4a to 4d may be formed by etching or by deposition.

As a concrete example, when the phase shift mask 4 is formed of quartz glass having a refractive index of 1.5 relative to a beam of light having a wavelength of 248 nm, a step of 124 nm is given between the first area 4a and the second area 4b, a step of 248 nm is given between the first area 4a and the third area 4c, and a step of 372 nm is given between the first area 4a and the fourth area 4d. Furthermore, a phase shift portion 4e is formed in the vicinity of an intersection of four phase shift lines which are boundaries of the respective areas 4a to 4d. A center 1d of the convex portion is positioned below the light absorption portion 1b in the transmission type amplitude modulation mask 1 so as to correspond to the phase shift portion 4e of the phase shift mask 4.

It is to be noted that FIG. 5A shows that the phase shift surface which is a surface on the side having the phase shift portion 4e is formed on the upper surface of the phase shift mask 4 for clarifying the drawing, but the phase shift surface of the phase shift mask 4 is formed on a surface on the second image-forming optical system 5 side (side opposite to the illumination optical system 2 side, i.e., the lower side in FIG. 1 on the exit side).

FIG. 5B is a top view showing a mask having basic unit parts depicted in FIG. 5A arranged on four flat planes as another example of the phase shift mask 4. The phase shift mask 4 shown in FIG. 5B is constituted by two-dimensionally arranging a plurality of the basic unit parts, i.e., arranging them in the form of a matrix of 2×2.

Although the phase shift mask 4 according to the first embodiment has four areas 4a to 4d having different thicknesses, it may have two areas with different thicknesses which give a phase difference of π to the transmitted light beam as shown in FIG. 5C, for example. When the phase shift mask 4 has two areas, these areas are alternately one-dimensionally arranged along one axis, and the phase shift portion is positioned on a boundary between the two types of areas.

The light beam that has the substantially uniform light intensity distribution projected from the illumination optical system 2 is transmitted through the transmission type amplitude modulation mask 1 and undergoes the amplitude modulation effect of the light intensity. As shown in FIGS. 3A and 3B, the light beam projected from the exit surface 1c of the transmission type amplitude modulation mask 1 has the lowest light intensity at a position corresponding to the center of the convex portion of the light absorption portion 1b, and the light intensity is increases as distanced from the center. Moreover, this light beam has a light intensity distribution such as that the light intensity is maximum at a position corresponding to the center of the convex portion of the light absorption portion 1b, i.e., an upward concave light intensity distribution. It is preferable to set the transmission type amplitude modulation mask 1 in such a manner a widthwise direction of the upward concave light intensity distribution becomes equal to a width of the pixel in the liquid crystal.

The intensity-modulated light beam projected from the transmission type amplitude modulation mask 1 illuminates the phase shift mask 4 through the first image-forming optical system 3. The light beam that is transmitted through the phase shift mask 4 is applied to the substrate 6 via the second image-forming optical system 5.

FIG. 6 is a cross-sectional view illustrating a basic effect of the phase shift mask 4 in the first embodiment in the partially enlarged manner. Description will now be given as to the basic effect of the phase shift mask 4 in a case that the transmission type amplitude modulation mask 1 is not interposed in a light path between the illumination optical system 2 and the phase shift mask 4, i.e., a case that the substantially uniform light beam enters.

In the phase shift mask 4, since a phase difference between two adjacent areas is set to π/2, the light intensity decreases at a position corresponding to a phase shift line 412 but it is not reduced to zero. On the other hand, since an integration value of complex transmittances in a circular area with an intersection of the phase shift lines 412 at the center is set to be zero, the light intensity becomes substantially zero at this intersection, i.e., a position corresponding to the phase shift portion 4e.

Therefore, as shown in FIG. 6, in regard to the light intensity distribution of the light beam transmitted through the phase shift mask 4 having a plurality of the basic unit parts, on the substrate 6, the light beam cyclically has the light intensity distribution of the inverse peak pattern, in which the light intensity has a minimum peak value, e.g., substantially zero, at a point corresponding to each phase shift portion 4e of the phase shift mask 4 and rapidly increases as distanced from the phase shift portion 4e. That is, a minimum position of the cyclic the light intensity distribution of the inverse peak pattern is determined by the phase shift portion 4e. It is to be noted that the cyclic light intensity distribution of the inverse peak pattern has substantially the same profiles on both the x-z plane and the y-z plane. Further, a widthwise dimension of the light intensity distribution of the inverse peak pattern varies in proportion to the ½ power of a distance (i.e., a defocus quantity) between the phase shift mask 4 and the substrate 6.

As described above, when the semiconductor film is irradiated with the light beam that cyclically has only the light intensity distribution of the inverse peak pattern as shown in FIG. 6, the lateral growth, which has started from a crystal nucleus toward the circumference, is stopped at the intermediate portion between the inverse peak pattern portions. In order to realize the sufficient lateral growth from the crystal nucleus, the crystallization apparatus according to the first embodiment has the transmission type amplitude modulation mask 1 and the first image-forming optical system 3 on the light path between the illumination optical system 2 and the phase shift mask 4.

Figure 7A:
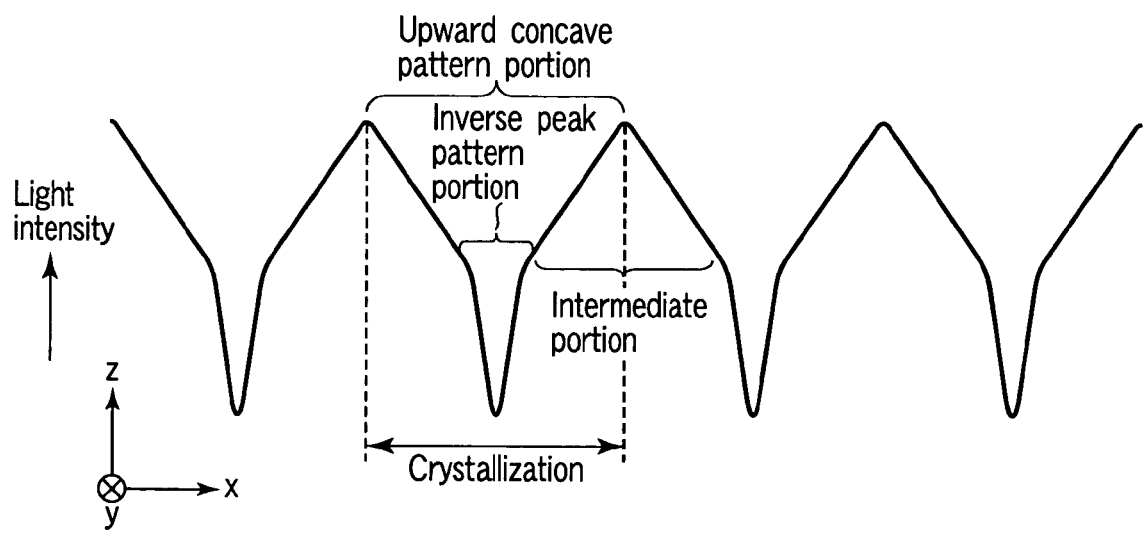
FIG. 7A is a view showing a light intensity distribution of a light beam transmitted through a transmission type amplitude modulation mask and a phase shift mask obtained on a substrate to be processed in an x-z plane.
Figure 7B:
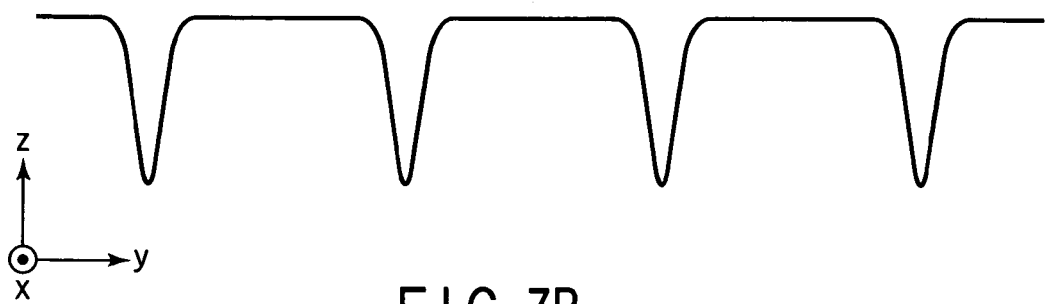
FIG. 7B is a view showing a light intensity distribution of a light beam transmitted through the transmission type amplitude modulation mask and the phase shift mask obtained on a substrate to be processed in a y-z plane.

FIGS. 7A and 7B are views showing the light intensity distribution of the light beam transmitted through the transmission type amplitude modulation mask 1 and the phase shift mask 4 which can be obtained on the substrate 6. In the first embodiment, as described above, the transmission type amplitude modulation mask 1 has a function to subject the light beam that has the uniform light intensity distribution to amplitude modulation and convert it into a light beam which cyclically has an upward concave light intensity distribution such as shown in FIG. 3B. On the other hand, the phase shift mask 4 has a function to convert a light beam that has a uniform light intensity distribution into a light beam which cyclically has the light intensity distribution of the inverse peak pattern such as shown in FIG. 6.

Since the crystallization apparatus according to the first embodiment has the transmission type amplitude modulation mask 1 and the phase shift mask 4, the light beam which has reached the substrate 6 undergoes the effects of both the transmission type amplitude modulation mask 1 and the phase shift mask 4. Therefore, the light beam that is applied to the semiconductor film of the substrate 6 cyclically has the light intensity distribution of the two-stage inverse peak pattern such as shown in FIG. 7A which is represented by a product of the light intensity distribution of the inverse peak pattern and the upward concave light intensity distribution which are distributed with the same cycle. In this cyclic light intensity distribution of the two-stage inverse peak pattern, the light intensity is substantially zero at a point corresponding to the phase shift portion 4*e* so as to be associated with the above-described light intensity distribution of the inverse peak pattern, and increases in a radial pattern as distanced from this point to reach a predetermined value. That is, a position where the light intensity is minimum in this cyclic light intensity distribution of the two-stage inverse peak pattern is determined by a position of the phase shift portion 4*e*.

Figure 8:
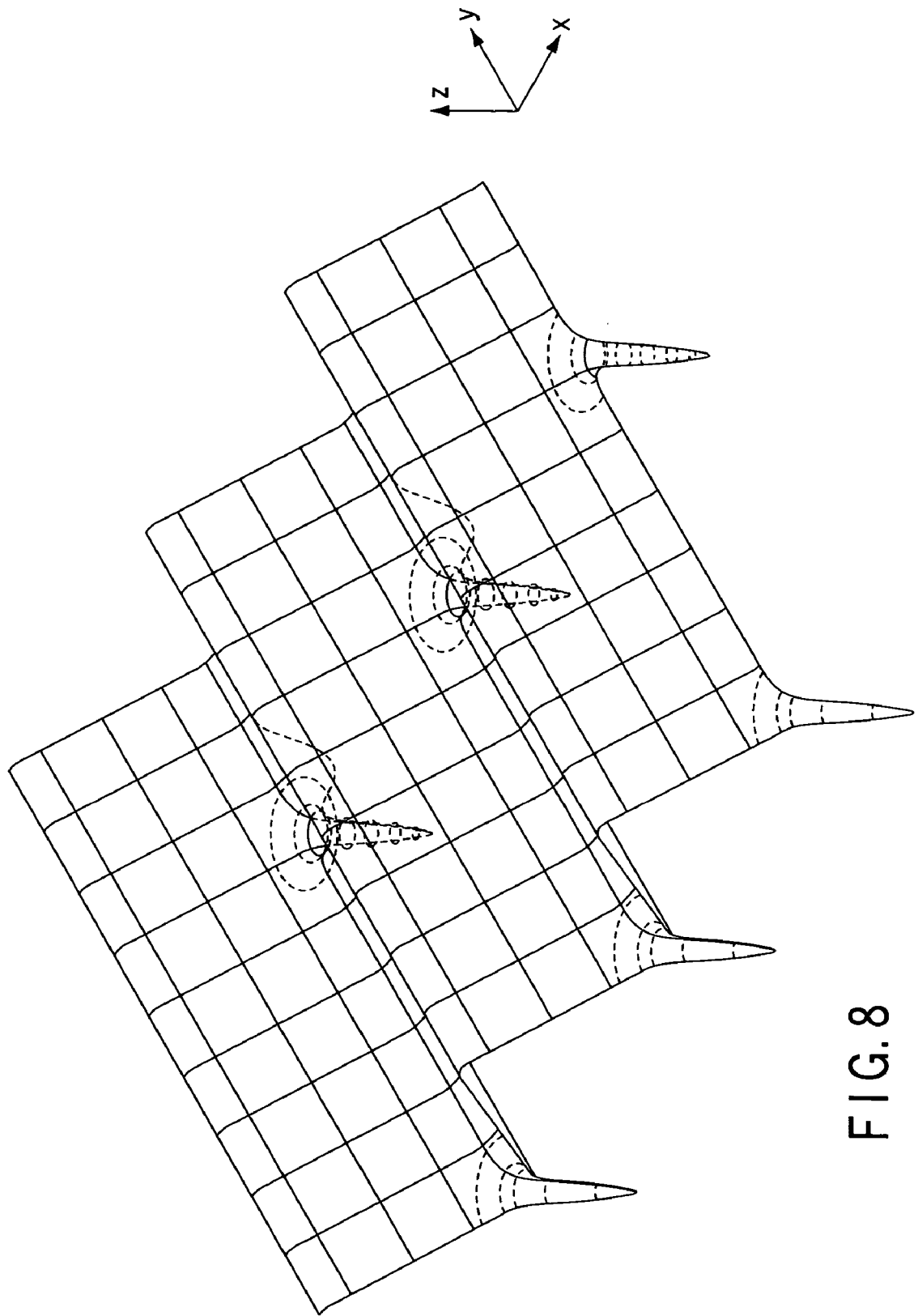
FIG. 8 is a view three-dimensionally showing the light intensity distribution depicted in FIGS. 7A and 7B.

In the first embodiment, the cyclic light intensity distribution of the two-stage inverse peak pattern corresponds to the cyclic upward concave light intensity distribution in the x-z direction and the cyclic upward concave light intensity distribution in the y-z direction and, as shown in FIG. 8, in the intermediate portion between the adjacent inverse peak pattern portions, the light intensity is uniform along the y direction and it increases or decreases substantially monotonously along the x direction. Furthermore, the light intensity distribution of the two-stage inverse peak pattern has an inflection point where an inclination decreases between the inverse peak pattern portion and the upward concave portion.

When the substrate 6 is irradiated with the light beam that has the light intensity distribution of the two-stage inverse peak pattern, a crystal nucleus is formed at a point where the light intensity is minimum, i.e., a part corresponding to a point where the light intensity is substantially zero (point corresponding to the phase shift portion 4*e*). In detail, the crystal nucleus is generated at a position where the inclination is large in the light intensity distribution of the inverse peak pattern. The polycrystalline is generated at the central portion of the inverse peak pattern portion, then the outer crystal becomes a nucleus, and the crystal growth. A position where the crystal grows is generally a position where the inclination is large.

Then, the lateral growth starts from the crystal nucleus along the x direction that a light intensity gradient (i.e., a temperature gradient) is large. In the light intensity distribution of the two-stage inverse peak pattern, since a part where the light intensity decreases does not substantially exist in the intermediate portion, the lateral growth reaches a peak from the crystal nucleus without stopping in mid course, thereby realizing growth of a large crystal. In particular, since the inflection point where the inclination decreases exists between the inverse peak pattern portion and the upward concave portion in the first embodiment, crystallization is carried out in a wide area extending from the central portion of the light intensity distribution of the two-stage inverse peak pattern in the widthwise direction when the semiconductor film of the substrate 6 is irradiated with the light beam that has the light intensity distribution of the two-stage inverse peak pattern. Furthermore, by setting the widthwise direction of the light intensity distribution of the two-stage inverse peak pattern is set equal to, e.g., a pixel pitch of the light crystal, the monocrystalline can be caused to grow with respect to each pixel. That is, a switching transistor comprising a thin film transistor can be formed in a monocrystalline area formed to each pixel.

Based on this, in the first embodiment, the sufficient lateral growth from the crystal nucleus can be realized, and the crystallized semiconductor film with a large particle size can be produced. Since the crystal generated by the crystallization apparatus according to the first embodiment has a large particle size, there is obtained the high mobility of electrons or electron holes in a direction (x direction) of the lateral growth. Therefore, a transistor with an excellent characteristic can be manufactured by arranging a source and a drain of the transistor in the direction of the lateral growth.

It is to be noted that very high resolution and image forming performance are required in the second image-forming optical system 5 positioned between the phase shift mask 4 and the substrate 6 in the first embodiment, but very high resolution and image forming performance are not required in the first image-forming optical system 3 positioned between the transmission type amplitude modulation mask 1 and the phase shift mask 4. In other words, the light beam that has the upward concave light intensity distribution formed on the surface of the substrate 6 by the effect of the transmission type amplitude modulation mask 1 is not very sensitively affected by resolutions of the first image-forming optical system 3 and the second image-forming optical system 5, but the light beam that has the light intensity distribution of the inverse peak pattern formed on the surface of the processed surface 6 by the effect of the phase shift mask 4 is very sensitively affected by a resolution of the second image-forming optical system 5.

Therefore, in the first embodiment, it is preferable to form the phase shift surface of the phase shift mask 4 on the second image-forming optical system 5 side. In such a structure, since the first image-forming optical system 3 includes a glass substrate part of the phase shift mask 4, the image forming performance is readily lowered due to an influence of the aberration of the glass substrate part. However, since the second image-forming optical system 5 does not include the glass substrate part of the phase shift mask 4, it is possible to assure the high resolution and image forming performance without being affected by the aberration.

Figure 10:
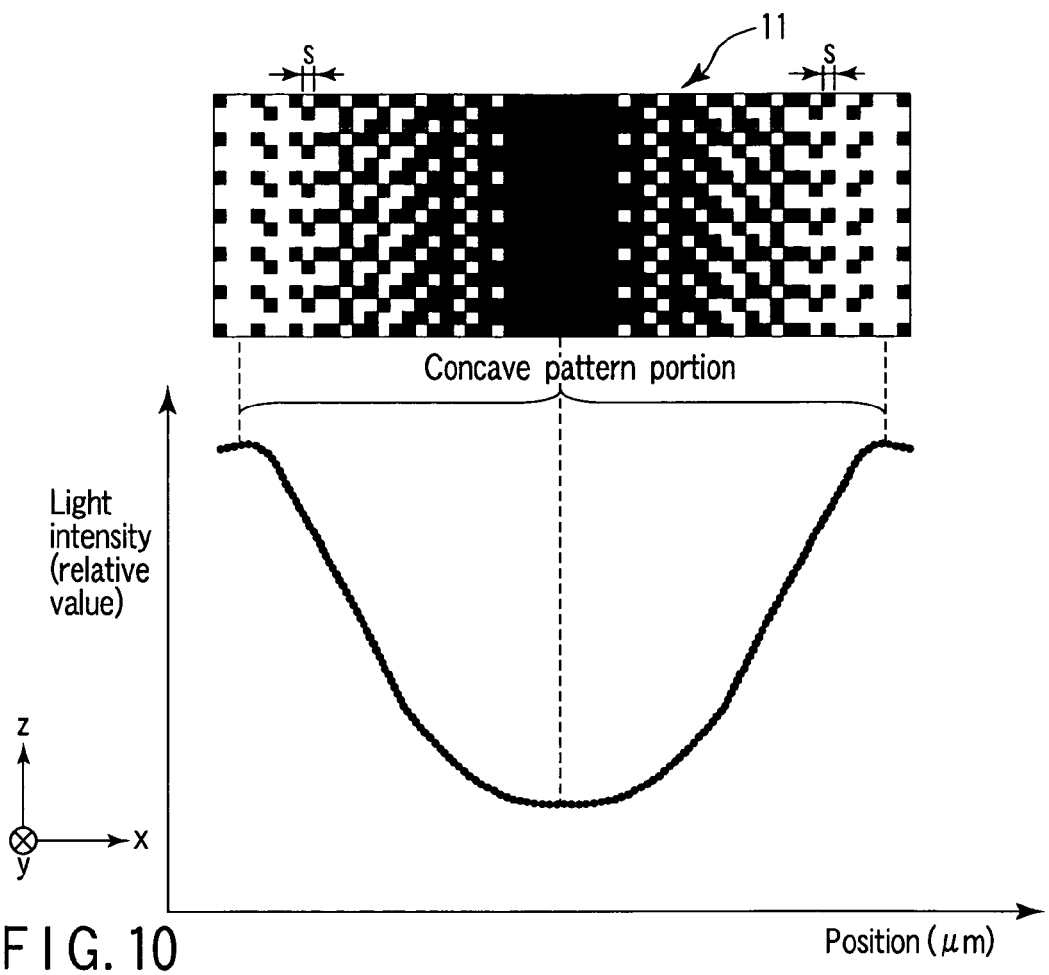
FIG. 10 is a top view of the open type amplitude modulation mask, illustrating an effect of this open type amplitude modulation mask.

FIG. 9 is a view schematically showing a crystallization apparatus according to a first modification of the first embodiment. The first modification of the first embodiment has a structure similar to that of the first embodiment, but it is basically different from the first embodiment in that an open type amplitude modulation mask 11 is provided in place of the transmission type amplitude modulation mask 1. Moreover, FIG. 10 is a top view of this open type amplitude modulation mask 11 for illustrating an effect of this open type amplitude modulation mask 11. The first modification will be described hereinafter regarding a difference from the first embodiment. It is to be noted that, in FIG. 9, the illustration of an internal structure of the illumination optical system 2 is eliminated for clarifying the drawing.

The open type amplitude modulation mask 11 according to the first modification of the first embodiment comprises a light transmission member having a fixed thickness and, as shown in FIG. 10, many minute transmission areas and many minute light shielding areas are distributed on a surface of this light transmission member (e.g., a surface on the first image-forming optical system 3 side, i.e., an exit surface) in a pattern that a central part is prevented from the light and the transmittance increases toward the both end portions. Specifically, the open type amplitude modulation mask 11 is formed by, e.g., sputtering each minute light shielding area comprising chrome having a square shape that a length of each side is s on a quartz glass substrate and then patterning it.

It is to be noted that FIG. 10 shows only the basic unit part of the open type amplitude modulation mask 11 for clarifying the drawing, but the open type amplitude modulation mask 11 actually has an arrangement that this basic unit part is one-dimensionally repeated along a direction of a numerical aperture distribution (x direction). Furthermore, although the numerical aperture distribution pattern is constituted as a combination of square elements having a fixed dimension in FIG. 10, it is not restricted thereto. It is possible to use an arbitrary pattern such as a combination of rectangles whose length or width varies. Moreover, the open type amplitude modulation mask 11 may not have the light transmission member, and forming an open portion to a metal plate can suffice, for example.

The distribution of the minute transmission areas and the minute light shielding areas in the basic unit parts of the open type amplitude modulation mask 11, i.e., a pattern forming the numerical aperture distribution is set in such a manner that the numerical aperture is minimum at the center of the back unit parts and the numerical aperture increases as distanced from the center of the basic unit parts. Additionally, the part where the numerical aperture distribution is minimum in the basic unit parts of the open type amplitude modulation mask 11 is positioned so as to correspond to the phase shift portion 4e in the basic unit parts of the phase shift mask 4. Therefore, the open type amplitude modulation mask 11 has a function to subject the light beam that has the substantially uniform light intensity distribution to amplitude modulation and convert it into a light beam that has an upward concave light intensity distribution that the light intensity is lowest in an area corresponding to the phase shift portion 4e and the light intensity increases as distanced from this area.

Further, in the first modification, an exit surface of the open type amplitude modulation mask 11 (surface that the light beam has the upward concave light intensity distribution) is arranged so as to be coupled with the surface of the substrate 6 in the optically conjugate relationship through the first image-forming optical system 3 and the second image-forming optical system 5. Thus, in the state that the phase shift mask 4 is not interposed, the light beam that is applied to the surface of the substrate 6 has the upward concave light intensity distribution that the light intensity is lowest in an area corresponding to the phase shift portion 4e and the light intensity increases as distanced from this area like the case of the exit surface of the open type amplitude modulation mask 11.

It is to be noted that the upward concave light intensity distribution has a substantially curved profile in the x-z plane as shown in FIG. 10, but the profile in the y-z plane is uniform. Furthermore, it is preferable that a widthwise direction of the upward concave light intensity distribution is set equal to a pixel pitch of the liquid crystal.

Since the crystallization apparatus according to the first modification has the open type amplitude modulation mask 11 and the phase shift mask 4, the light beam which reaches the substrate 6 undergoes the effects of both the open type amplitude modulation mask 11 and the phase shift mask 4. Therefore, like the first embodiment, the light beam that is applied to the semiconductor film of the substrate 6 cyclically has the light intensity distribution of the two-stage inverse peak pattern as shown in FIG. 7A which is represented by a product of the light intensity distribution of the inverse peak pattern and the upward concave light intensity distribution which are distributed with the same cycle like the first embodiment. In this cyclic light intensity distribution of the two-stage inverse peak pattern, the light intensity is substantially zero in an area corresponding to the phase shift portion 4e, and rapidly increases in a radial pattern as distanced from this area to reach a predetermined value, corresponding to the light intensity distribution of the inverse peak pattern. That is, a position where the light intensity is minimum in this cyclic light intensity distribution of the two-stage inverse peak pattern is determined by a position of the phase shift portion 4e.

In the first modification, like the first embodiment, since the semiconductor film of the substrate 6 is irradiated with a light beam that has the light intensity distribution of the two-stage inverse peak pattern by the effects of both the open type amplitude modulation mask 11 and the phase shift mask 4, the lateral growth reaches a peak without stopping in mid course, thereby generating a crystallized semiconductor film with a large particle size.

It is to be noted that since the numerical aperture distribution of the open type amplitude modulation mask 11 varies discretely (multilevel manner) rather than continuously, fine irregularities are apt to be generated in the upward concave light intensity distribution of the light beam subjected to amplitude modulation by the effect of the open type amplitude modulation mask 11 when the semiconductor film of the substrate 6 is irradiated with this light beam. However, even if fine irregularities are generated in the upward concave light intensity distribution, the fine irregularities in the light intensity distribution are averaged when the light intensity distribution is converted into a temperature distribution. If they do not substantially remain as fine irregularities in the temperature distribution, the influence of the fine irregularities can be ignored.

In order to substantially suppress generation of the fine irregularities in the upward concave light intensity distribution, it is preferable to satisfy the following conditional expression (1) in such a manner that a resolution of the first image-forming optical system 3 is larger (lower) than a unit dimension s of the aperture.

$$s < 1.22 \times \lambda / NA1 \tag{1}$$

where $\lambda$ is a central wavelength of the light beam projected from the illumination optical system 2, and NA1 is a numerical aperture on the exit side of the first image-forming optical system 3. That is, a right value of an inequality sign symbol indicates a resolution R1 of the first image-forming optical system 3 in the conditional expression (1).

Therefore, in the first modification, even if the numerical aperture distribution in the open type amplitude modulation mask 11 varies discretely (multilevel manner) by setting a resolution of the first image-forming optical system 3 low to some extent, the semiconductor film of the substrate 6 can be irradiated with the light beam that has the upward concave light intensity distribution which smoothly varies, as shown in FIG. 10. Alternatively, in order to substantially suppress generation of fine irregularities in the upward concave light intensity distribution formed on the semiconductor film of the substrate 6, an appropriate aberration may be intentionally given to the first image-forming optical system 3. Furthermore, if chrome is apt to be deteriorated due to the laser beam that is applied to the open type amplitude modulation mask 11, it is preferable to relatively lower a luminous intensity of the laser beam to be projected by constituting the first image-forming optical system 3 as a reduction optical system.

Figure 12:
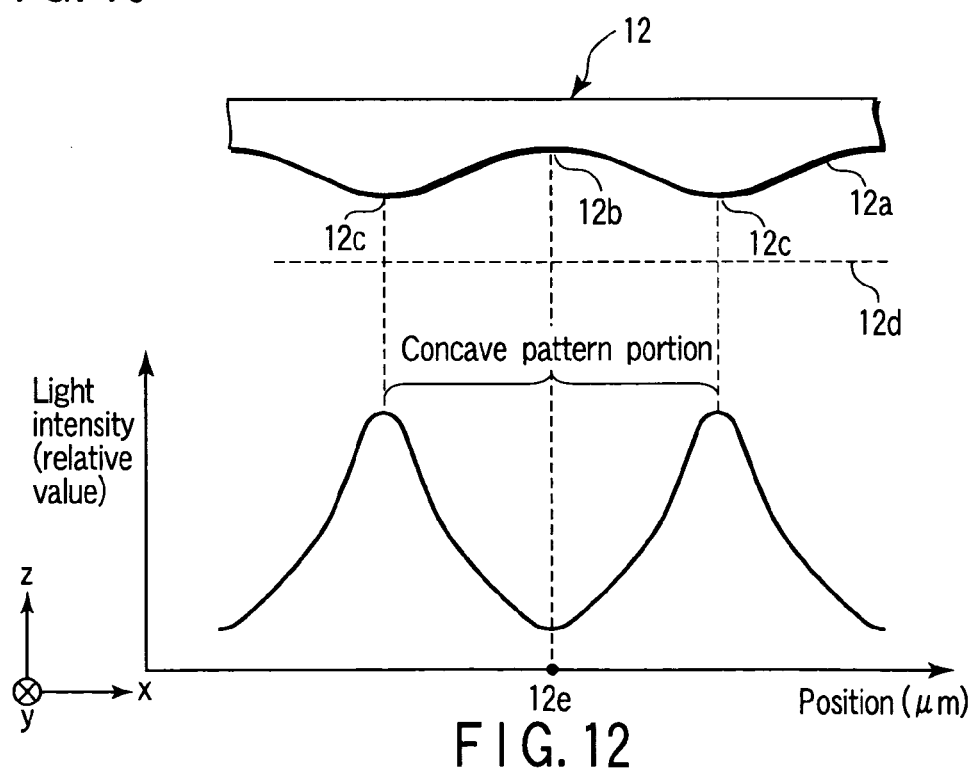
FIG. 12 is a side view of a converging/diverging element, illustrating an effect of this converging/diverging element.

FIG. 11 is a view schematically showing a crystallization apparatus according to a second modification of the first embodiment. Although the second modification of the first embodiment has a structure similar to that of the first embodiment, the crystallization apparatus according to the second modification is basically different from the first embodiment in that a converging/diverging element 12 as a phase modulation mask is provided in place of the transmission type amplitude modulation mask 1. Furthermore, FIG. 12 is a side view of this converging/diverging element 12 for illustrating an effect of this converging/diverging element 12. The second modification will be described hereinafter regarding a difference from the first embodiment. It is to be noted that, in FIG. 11, the illustration of the internal structure of the illumination optical system 2 is eliminated for clarifying the drawing.

As shown in FIG. 12, the basic unit part of the converging/diverging element 12 has two convex portions protruding toward the exit side of the light beam and a concave portion sandwiched between these convex portions, and these convex portions and the concave portion form a refraction surface 12a having a substantially sinusoidal shape as a whole. The two convex portions is converging refraction surfaces 12c, which converge the light beam that has entered the converging/diverging element 12, and the concave portion is a diverging refraction surface 12b, which diverges the light beam. With the converging refraction surfaces 12c and the diverging refraction surface 12b, the basic unit portion of the converging/diverging element 12 has a one-dimensional refraction function along the x direction.

In the refraction surface 12a with the sinusoidal shape of the converging diverging element 12, the converging/diverging element 12 and the phase shift mask 4 are positioned in such a manner that the center of the diverging refraction surface 12 corresponds to the phase shift portion 4e of the basic unit part of the phase shift mask 4, and the central part of the converging refraction surface 12c (i.e., a most protruding central line) corresponds to each central line parallel to the y direction of the first to fourth areas.

It is to be noted that FIG. 12 shows only the basic unit part of the converging/diverging element 12 for clarifying the drawing, but the converging/diverging element 12 actually has a conformation that this basic unit part is one-dimensionally repeated in a direction that it has a refraction function (x direction).

Of the light beam with the uniform light intensity distribution which has entered the basic unit part of the converging/diverging element 12, the light beam transmitted through the diverging refraction surface 12b undergoes the diverging effect, and the light beam transmitted through the converging refraction surface 12c undergoes the converging effect and reaches a predetermined plane 12d distanced from the exit surface of the converging/diverging element 12 toward the first image-forming optical system 3 side with a small gap. As shown in FIG. 12, the light beam transmitted through the converging/diverging element 12 cyclically has on the predetermined plane 12d an upward concave pattern light intensity distribution, which has the light intensity that is minimum in each phase shift portion 4e and increases as distanced from the phase shift portion 4e. Specifically, as to the upward concave light intensity distribution, the light intensity is minimum at a position corresponding to the center of the diverging refraction surface 12b and the light intensity is maximum at a position corresponding to the center of the converging refraction surface 12c.

It is to be noted that the upward concave light intensity distribution has a curved profile such as shown in FIG. 12 in the x-z plane, but the profile in the y-z plane is uniform. Moreover, it is preferable to set a widthwise direction of the upward concave light intensity distribution so as to be equal to a pixel pitch of the liquid crystal.

In the second modification, although the refraction surface of the converging/diverging element 12 one-dimensionally has a refraction function, it is not restricted thereto, and it may two-dimensionally have a refraction function along two orthogonal directions. In this case, the upward concave light intensity distribution formed on the substrate 6 by the effect of the converging/diverging element 12 has the same concave profile in two orthogonal planes.

The predetermined plane 12d is arranged so as to have an optically conjugate relationship with the surface of the substrate 6 through the first image-forming optical system 3 and the second image-forming optical system 5. Therefore, when the phase shift mask 4 is not interposed, the light beam that has the uniform light intensity distribution from the illumination optical system 2 is converted by the converging/diverging element 12 as a phase modulation mask to the light beam that has the upward concave light intensity distribution to illuminate the surface of the substrate 6.

Since the crystallization apparatus according to the second modification has the converging/diverging element 12 and the phase shift mask 4, the light beam which has reached the substrate 6 undergoes the effects of both the converging/diverging element 12 and the phase shift mask 4. Therefore, the light beam that is applied to the semiconductor film of the substrate 6 cyclically has the light intensity distribution of the two-stage inverse peak pattern as shown in FIG. 7A, which is represented by a product of the light intensity distribution of the inverse peak pattern and the upward concave light intensity distribution which are distributed with the same cycle. In this cyclic light intensity distribution of the two-stage inverse peak pattern, the light intensity is substantially zero at a point corresponding to the phase shift portion 4e and rapidly increases to reach a predetermined value as distanced in radial from this point, corresponding to the above-described light intensity distribution of the inverse peak pattern. That is, a position at which this cyclic light intensity distribution of the two-stage inverse peak pattern is determined by a position of the phase shift portion 4e.

In the second modification, like the first embodiment, since the semiconductor film of the substrate 6 is irradiated with the light beam that has the light intensity distribution of the two-stage inverse peak pattern by the effects of both the converging/diverging element 12 and the phase shift mask 4, the lateral growth reaches a peak from a crystal nucleus without stopping in mid course, thereby generating the crystallized semiconductor film having a large particle size.

In order to manufacture the converging/diverging element 12, a resist is applied on a surface of, e.g., a quartz glass substrate, a dose quantity is continuously changed, and electron beam plotting and developing processing are applied, thus generating a resist film having a continuous curved shape. Thereafter, a dry etching technique is used, and the converging/diverging element 12 having a refraction surface with a continuous curved shape is thereby formed. It is to be noted that the converging/diverging element 12 having a refraction surface with a step-like shape may be formed by repeating formation and patterning of the resist film for multiple number of times in the above-described manufacturing process, for example.

FIG. 13A is a view showing a converging/diverging element 12 having a refraction surface with a step-like shape. Further, FIG. 13B is a view showing a simulation result concerning the upward concave light intensity distribution of the light beam obtained on the phase shift mask 4. As shown in FIGS. 13A and 13B, when the converging/diverging element 12 has a refraction surface with a step-like shape (refraction surface approximated by, e.g., an eight-level step), the light intensity distribution of the light beam on the predetermined plane 12d on the exit side of the converging/diverging element 12 does not smoothly change. In the second modification, however, the semiconductor film of the substrate 6 can be irradiated with the light beam that has the upward concave light intensity distribution that smoothly varies as shown in FIG. 13C by setting a resolution of the first image-forming optical system 3 low to some extent, even if the refraction surface of the converging/diverging element 12 is approximated by the step.

It is to be noted that the converging/diverging element 12 is not restricted to a continuous curved surface of its multi-step approximation, and it may be constituted as a "kinoform" obtained by folding back a range of 0 to 2 π of a phase difference. Moreover, the converging/diverging effect of the converging/diverging element 12 may be realized by a refractive index distribution of an optical material without giving the refraction surface to the converging/diverging element 12. In this case, it is possible to use a prior art such as a photopolymer or ion exchange of glass by which a refractive index is modulated by the light intensity. Additionally, an optical switching effect equivalent to the converging/diverging element 12 may be realized by using a hologram or a diffraction optical element.

Figure 14:
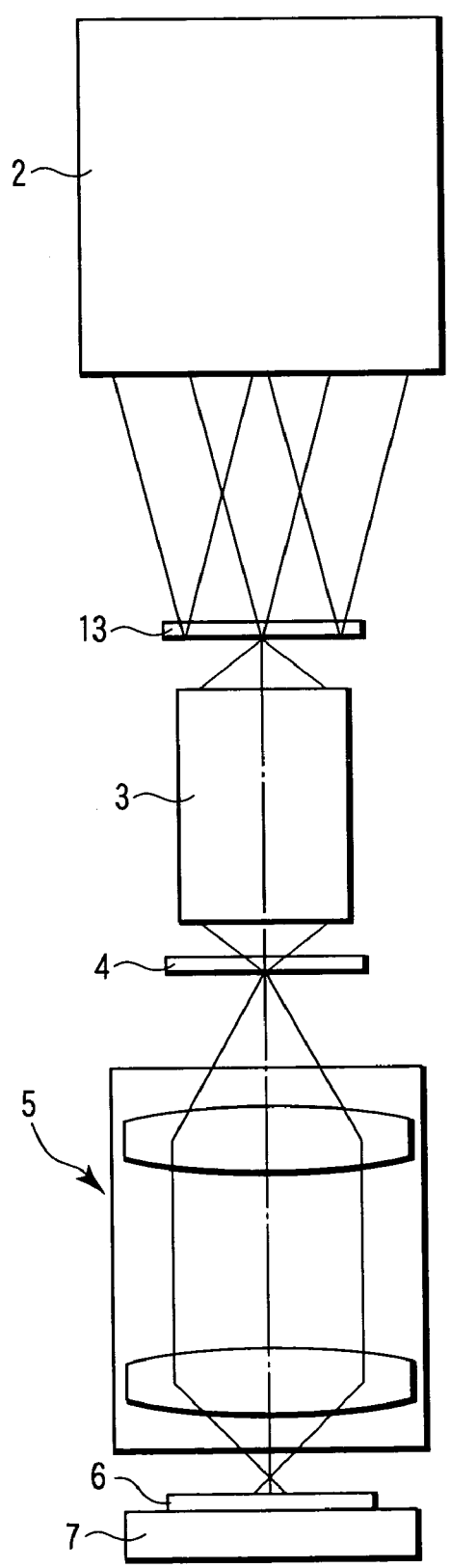
FIG. 14 is a view schematically showing a crystallization apparatus according to a third modification of the first embodiment.
Figure 15:
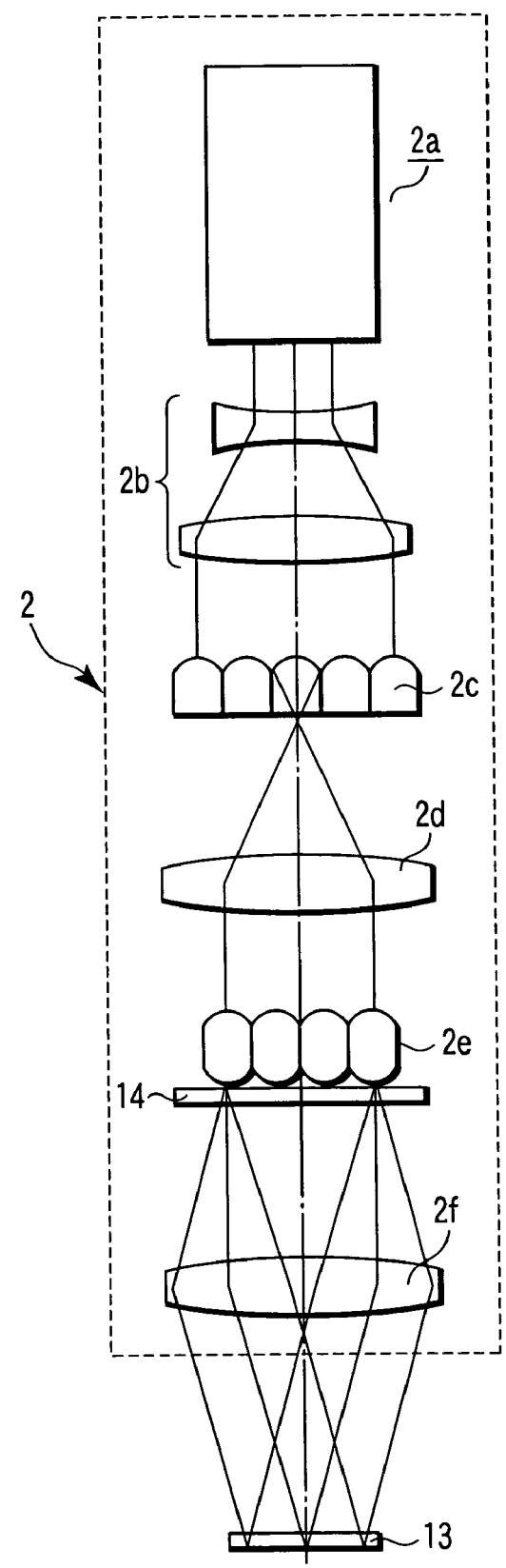
FIG. 15 is a view schematically showing an illumination optical system of FIG. 14.

FIG. 14 is a view schematically showing a crystallization apparatus according to a third embodiment of the first embodiment. Further, FIG. 15 is a view schematically showing the illumination optical system 2 depicted in FIG. 14. Although the third modification according to the first embodiment has a structure similar to the first embodiment, the crystallization apparatus according to the third modification is basically different from the first embodiment in that a micro lens array 13 is arranged in place of the transmission type amplitude modulation mask 1 and a transmission filter 14 which is a light intensity distribution formation element is provided on an illumination pupil plane of the illumination optical system 2 or in the vicinity thereof. The third modification will now be described hereinafter regarding a difference from the first embodiment.

As shown in FIG. 13, in the third modification, the micro lens array 13 is arranged at a position of the transmission type amplitude modulation mask 1 in the first embodiment. Further, as shown in FIG. 14, a transmission filter 14 is arranged on a rear side focal plane (i.e., the illumination pupil plane) of a second fly-eye lens 2e or in the vicinity thereof in the illumination optical system 2.

Figure 16:
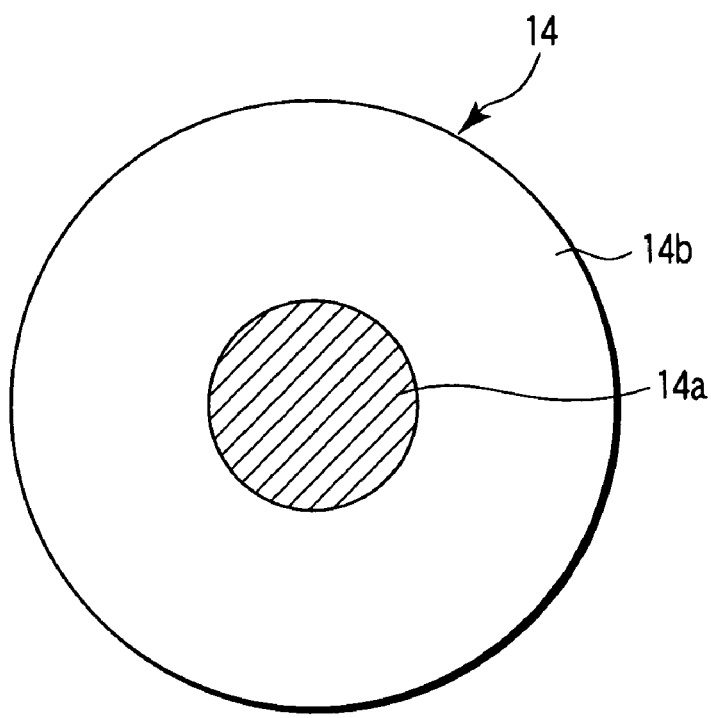
FIG. 16 is a view schematically showing a structure of a transmission filter arranged on an illumination pupil plane of in the vicinity thereof.

FIG. 16 is a view schematically showing a structure of the transmission filter 14 arranged on the illumination pupil plane or in the vicinity thereof. The transmission filter 14 has a circular central area 14a having a transmittance of, e.g., 50% and a toric peripheral area 14b which is formed so as to surround this central area 14a and has a transmittance of substantially 100%. That is, on the illumination pupil plane or in the vicinity thereof, the light intensity of the light beam which has transmitted through the central area 14a is relatively low, and the light intensity of the light beam which has transmitted through the peripheral area 14b is relatively high. Therefore, the illumination optical system 2 projects the light beam that has the light intensity distribution that the light intensity is lower at the center than in the peripheral part in the overlapping manner.

It is to be noted that the central area 14a of the transmission filter 14 is formed by forming a chrome film (or a ZrSiO film or the like) having a thickness according to, e.g., a transmittance by a sputtering method or the like and then applying patterning by using, e.g., etching. In case of this structure, the chrome as a light shielding material reflects a part of the light and absorbs a part of the light.

The central area 14a of the transmission filter 14 can be obtained by forming a chrome film (or a ZrSiO film or the like) having a thickness according to, e.g., a transmittance by a sputtering method or the like and then applying patterning by using, e.g., etching. The chrome as a light shielding material reflects a part of the light and absorbs a part of the light. Further, the central area 14a can be also obtained by forming a multilayer film designed so as to partially reflect the light having a wavelength used and applying patterning thereto.

In case of using the multilayer film as a reflection material, although there is an advantage that heat is not generated by absorption of unnecessary light, consideration must be given to prevent the reflected light from becoming stray light, which can be a factor of a flare. Furthermore, a type and a thickness of a light shielding material or a reflection material must be adjusted in the central area 14a and the peripheral area 14b in order to avoid substantial generation of a phase difference. It is to be noted that, in the third modification, the central area 14a has a circular shape but it may have any other shape such as a triangle or a rectangle.

Figure 17:
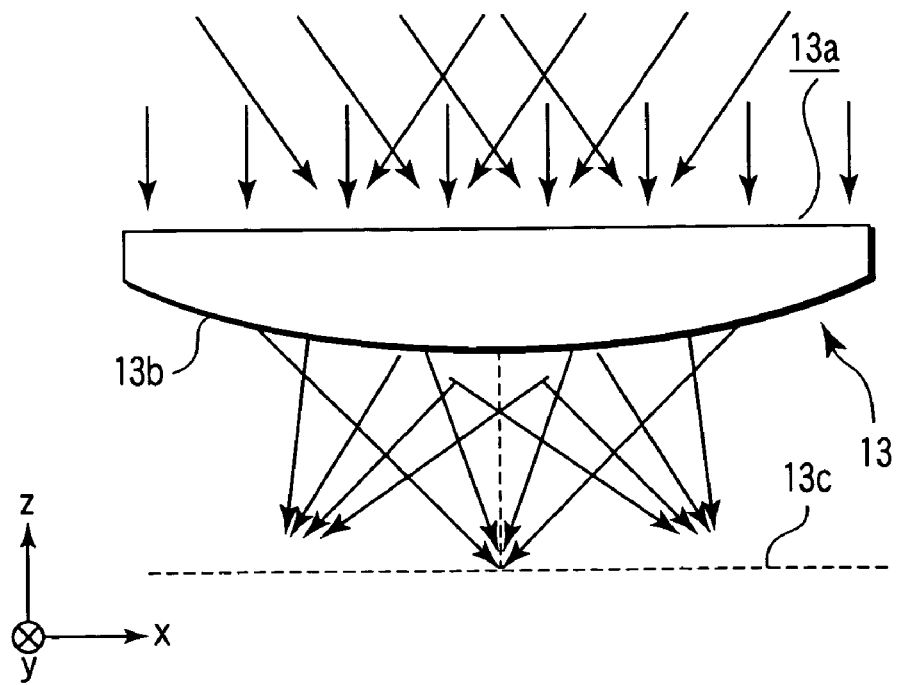
FIG. 17 is a view schematically showing a basic unit part of a micro lens array.

FIG. 17 is a view schematically showing the basic unit part of the micro lens array 13. Referring to FIG. 17, a minute lens element (optical element) 13a which is the basic unit part of the micro lens array 13 has a refraction surface 13b having a quadric surface shape such as a spherical shape protruding toward the first image-forming optical system 3 side. With this refraction surface 13b, the minute lens element 13a of the micro lens array 13 has a secondary converging function along the x direction and the y direction. Moreover, the center of the refraction surface 13b of each minute lens element 13a is positioned so as to correspond to the phase shift portion 4e of the basic unit of the phase shift mask 4. It is to be noted that FIG. 17 shows only the basic unit part of the micro lens array 13 for clarifying the drawing, but the minute lens element 13a of the micro lens array 13 is two-dimensionally (in the both vertical and horizontal directions and carefully) arranged.

The light beam which has entered the minute lens element 13a of the micro lens array 13 undergoes a converging effect through the refraction surface 13b, and a spot-like light beam is formed on a focal plane of the minute lens element 13a (i.e., a rear side focal plane of the micro lens array 13). In this manner, the micro lens array 13 is arranged on a light path between the illumination optical system 2 and the phase shift mask 4, and constitutes a wavefront splitting element, which wavefront-splits the light beam that has entered from the illumination optical system 2 into a plurality of light beams and converges each wavefront-split light beam onto a corresponding phase shift portion 4e or in the vicinity thereof. In the third modification, the rear side focal plane 13c of the micro lens array 13 is arranged so as to have an optically conjugate relationship with the surface of the substrate 6 through the first image-forming optical system 3 and the second image-forming optical system 5.

FIG. 17 is a view illustrating a light intensity distribution of a light beam on the rear side focal plane 13c obtained by the effects of both the transmission filter 14 and the micro lens array 13. As shown in FIG. 17, as to the light beam which has been transmitted through the micro lens array 3 via the transmission filter, a quantity of the light beam which enters vertically is small, and a quantity of the light beam which enters obliquely is relatively large. Therefore, on the rear side focal plane 13c, this light beam has an upward concave light intensity distribution, which has the light intensity that is minimum in each phase shift portion 4e and increases as distanced from the phase shift portion 4e. Specifically, in regard to the upward concave light intensity distribution, the light intensity is minimum at a position corresponding to the center of the refraction surface 13b and is maximum at positions corresponding to the both end portions of the refraction surface 13b.

It is to be noted that the upward concave light intensity distribution has the same profile in both the x-z plane and the y-z plane. Moreover, it is preferable to set a widthwise dimension of the upward concave light intensity distribution so as to be equal to a pixel pitch of the liquid crystal.

FIG. 18 is a view showing a light intensity distribution obtained on the substrate by a cooperative effect of the transmission filter 14, the micro lens array 13 and the phase shift mask 4. As described above, the transmission filter 14 has a function to convert a light beam that has a uniform light intensity distribution into a light beam that has an upward concave light intensity distribution that the light intensity is minimum at the center and the light intensity increases as distanced from the center. The micro lens array 13 has a function to convert an incident light beam into a spot-like light beam that is applied to only a predetermined area. Additionally, the phase shift mask 4 has a function to convert a light beam that has a uniform light intensity distribution into a light beam that has the light intensity distribution of the inverse peak pattern as shown in FIG. 7B.

Further, as described above, the rear side focal plane 13c of the micro lens array 13 as a phase modulation mask and the surface of the substrate 6 are arranged so as to have an optically conjugate relationship. Therefore, in the state that the phase shift mask 4 is not interposed, when the light beam that has the uniform light intensity distribution is transmitted through the micro lens array 13, the surface of the substrate 6 is irradiated with the light beam that has the upward concave light intensity distribution.

Since the crystallization apparatus according to the third modification has the transmission filter 14, the micro lens array 13 and the phase shift mask 4, the light beam that reaches the substrate 6 undergoes the effects of these members. Therefore, the light beam which reaches the semiconductor film of the substrate 6 is converted into the spot-like light beam that is applied to only a predetermined area, and has the light intensity distribution of the two-stage inverse peak pattern as shown in FIG. 19, which is represented by a product of the light intensity distribution of the inverse peak pattern and the upward concave light intensity distribution that have the same cycle. In this light intensity distribution of the two-stage inverse peak pattern, the light intensity is substantially zero at a point corresponding to the phase shift portion 4e and rapidly increases as distanced in radial from this point to reach a predetermined value, corresponding to the above-described light intensity distribution of the inverse peak pattern. That is, a position where the light intensity is minimum in this light intensity distribution of the two-stage inverse peak pattern is determined by a position of the phase shift portion 4e.

Figure 20:
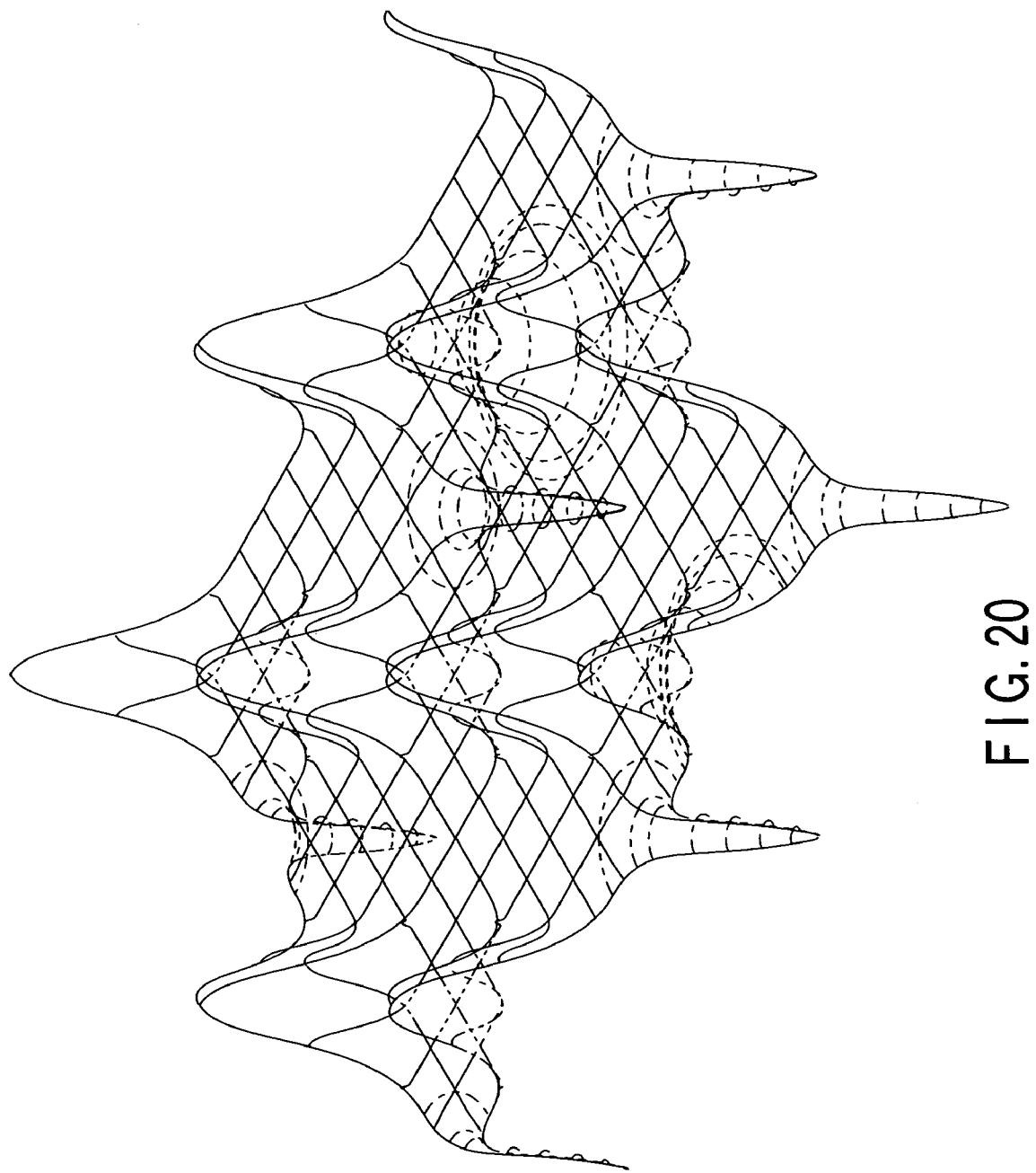
FIG. 20 is a view three-dimensionally showing the light intensity distribution depicted in FIG. 19.

In each modification of the first embodiment, the light intensity distribution of the two-stage inverse peak pattern corresponds to the cyclic upward concave light intensity distribution in the x-z direction and the cyclic upward concave light intensity distribution in the y-z direction. As shown in FIG. 20, an intermediate portion between the adjacent inverse peak pattern portions is substantially monotonously increased along the x direction and the y direction. Further, the light intensity distribution of the two-stage inverse peak pattern has an inflection point where an inclination decreases between the inverse peak pattern portion and the upward concave portion.

In each modification, like the first embodiment, when the substrate 6 is irradiated with the light beam that has the light intensity distribution of the two-stage inverse peak pattern, a crystal nucleus is formed at a point where the light intensity is minimum, i.e., a point where the light intensity is substantially zero (point corresponding to the phase shift portion 4e). In detail, the crystal nucleus is generated at a position where the inclination is large in the light intensity distribution of the inverse peak pattern. The polycrystalline is generated at a central portion of the inverse peak pattern portion, the crystal on the outer side thereof becomes a nucleus, and the crystal grows. A position at which the crystal grows is generally a position where the inclination is large.

Then, the lateral growth starts from the crystal nucleus along the x direction where a light intensity gradient (i.e., a temperature gradient) is large. In the light intensity distribution of the two-stage inverse peak pattern, since a part where the light intensity decreases does not substantially exist in the intermediate portion, the lateral growth reaches a peak without stopping in mid course, thereby realizing growth of the large crystal. In particular, since an inflection point where the inclination decreases exists between the inverse peak pattern portion and the upward concave portion in the first embodiment, when the semiconductor film of the substrate 6 is irradiated with the light beam that has the light intensity distribution of the two-stage inverse peak pattern, crystallization is carried out in a wide area extending from the center of the light intensity distribution of the two-stage inverse peak pattern in the widthwise direction. Therefore, the monocrystalline can be generated with respect to each pixel by equalizing the widthwise direction of the light intensity distribution of the two-stage inverse peak pattern to a pixel pitch of the liquid crystal.

As described above, in each modification of the first embodiment, sufficient lateral growth from the crystal nucleus can be realized, and a crystallized semiconductor film with a large particle size can be generated. Since the crystal generated by the crystallization apparatus according to the first embodiment has a large particle size, it has the high electron mobility in a direction of the lateral growth (x direction). Therefore, arranging a source and a drain of a transistor in the direction of the lateral growth enables production of the transistor with the excellent characteristic.

Further, in the third modification, light that has entered the micro lens array 13 is wavefront-split by many minute lens elements 13a, and the light beam converged through each minute lens element 13a is formed into a spot shape. Therefore, a large part of the light supplied from the illumination optical system 2 can be caused to contribute to crystallization in only a desired transistor area, thereby realizing crystallization with the excellent light efficiency.

In the third modification, although the refraction surface 13b of the minute lens element 13a of the micro lens array 13 has a spherical shape, it may have a shape having curvatures different in the x direction and the y direction. When the curvatures of the refraction surface 13b in the x direction and the y direction are different from each other, a spot-like light beam area has an oval shape. Since a major axis and a minor axis of this oval shape correspond to the widthwise directions of the light intensity distribution of the two-stage inverse peak pattern in the x direction and the y direction, a gradient of the light intensity in the inverse peak pattern portion differs in the x direction and the y direction when the spot-like light beam area is formed into an oval shape. Therefore, a degree of the lateral growth can be changed along each direction by setting a curvature of the refraction surface 13b.

Figure 22:
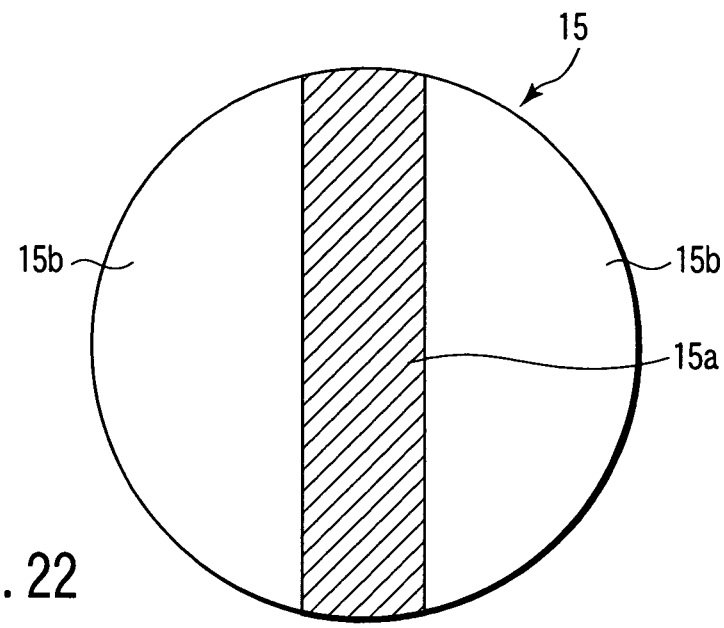
FIG. 22 is a view showing a modification transmission filter according to the third modification of FIG. 13.

In the third modification, the micro lens array 13 as a wavefront splitting element has a plurality of optical elements (minute lens elements) 13a constituted by being two-dimensionally arranged, and each optical element 13a has a two-dimensional converging function through the refraction surface 13b having a quadric surface shape. However, the present invention is not restricted thereto, and such a micro cylindrical lens array 13' as shown in FIG. 21 can be used, for example. The micro cylindrical lens array 13' has a plurality of optical elements 13'a one-dimensionally arranged in a predetermined direction, and each optical element 13'a has a refraction surface 13'b having a one-dimensional converging function along a predetermined direction. In this case, it is desirable to use such a transmission filter 15 as shown in FIG. 22 in accordance with a use of the micro cylindrical lens array 13'.

The transmission filter 15 includes an elongated rectangular central area 15a having a transmittance of, e.g., 50% and a pair of semicircular peripheral areas 15b which are formed so as to sandwich this central area 15a and have a transmittance of substantially 100%. A longitudinal direction of the central area 15a of this transmission filter 15 and a longitudinal direction of each minute cylindrical lens element 13'a of the micro cylindrical lens array 13' are set so as to be optically associated with each other. Although the central area 15a is defined by substantially parallel chords, it is not restricted thereto, and any other shape may be adopted.

The light beam which has entered the micro cylindrical lens array 13' is wavefront-split by many minute cylindrical lens elements 13'a, and the light beam converged through each minute cylindrical lens element forms a slit-shaped (linear) light beam which surrounds each transistor area on the substrate 6.

Figure 23:
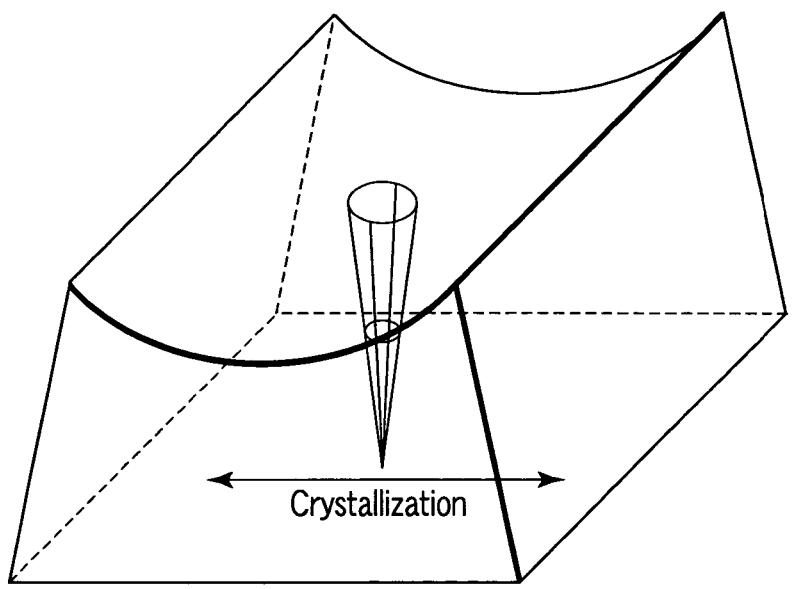
FIG. 23 is a view showing a light intensity distribution of a light beam transmitted through the transmission filter and the micro lens cylindrical lens array of the third modification.
Figure 26:
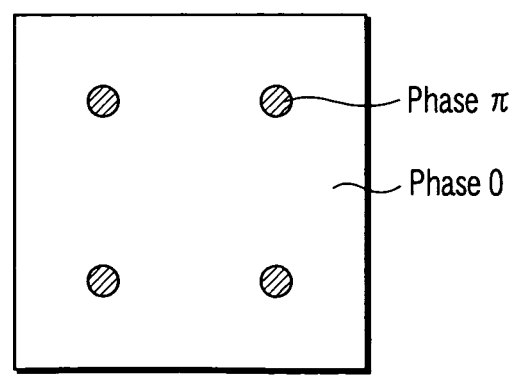
FIG. 26 is a view showing a modification of the phase shift mask.

Therefore, the light intensity distribution of the slit-shaped light beam that is applied to the substrate 6 has such a two-stage inverse peak pattern profile as shown in FIG. 23 along a short side direction of the slit and has a uniform profile along the longitudinal direction. That is, the light beam that is transmitted through the micro cylindrical lens array 13' and the transmission filter 15 and then applied to the substrate 6 has a light intensity distribution as shown in FIG. 23.

When the substrate 6 is irradiated with the light beam that has the light intensity distribution of the two-stage inverse peak pattern as shown in FIG. 23, a crystal nucleus is formed at a point where the light intensity is minimum, i.e., a point where the light intensity is substantially zero. Then, the lateral growth starts from this crystal nucleus along a is direction with a light intensity gradient (lateral direction in FIG. 22). In the light intensity distribution of the two-stage inverse peak pattern as shown in FIG. 23, since a part where the light intensity decreases does not actually exist in the intermediate portion, the lateral growth reaches a peak without stopping in mid course, thereby realizing growth of the large crystal.

It is to be noted that, in the third modification, the refraction surfaces of the micro lens array 13 and the micro cylindrical lens array 13' may be formed into a continuous curved surface shape or a step-like shape. Further, it is not restricted to a continuous curved surface or its multilevel approximation, and a split wavefront element can be constituted as a "kinoform" obtained by folding back a range of 0 to 2 π it of a phase difference. Furthermore, the effect may be realized by a refractive index distribution of an optical material without giving the refraction surface to the split wavefront element. In this case, it is possible to use a prior art such as a photopolymer whose refractive index is modulated by a light intensity, ion exchange of glass, and others. Moreover, the split wavefront element may be realized by using a hologram or a diffraction optical element.

Additionally, in the first embodiment and each modification, the second image-forming optical system 5 is interposed on the optics between the phase shift mask 4 and the substrate 6, and a gap between the substrate 6 and the second image-forming optical system 5 is relatively largely assured. Thus, the phase shift mask 4 is not contaminated due to ablation of the substrate 6. Therefore, the excellent crystallization can be realized without being affected by ablation of the substrate 6.

Further, in the first embodiment and each modification, since a gap between the substrate 6 and the second image-forming optical system 5 is relatively largely assured, a positional relationship between the substrate 6 and the second image-forming optical system 5 can be readily adjusted by leading detection light to detect a position to the light path between the substrate 6 and the second image-forming optical system 5.

Figure 24:
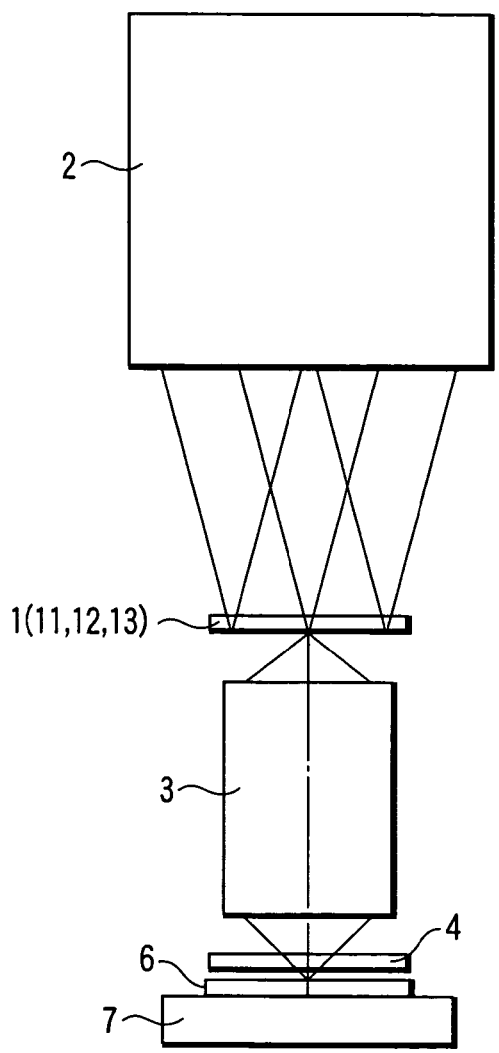
FIG. 24 is a view schematically showing a crystallization apparatus according to a second embodiment of the present invention.

FIG. 24 is a view schematically showing a crystallization apparatus according to a second embodiment of the present invention. Although the second embodiment has a structure similar to that of the first embodiment, the second embodiment is basically different from the first embodiment in that the second image-forming optical system 5 is removed from the light path between the phase shift mask 4 and the substrate 6. The second embodiment will now be described hereinafter regarding a difference from the first embodiment. It is to be noted that, in FIG. 21, the illustration of the internal structure of the illumination optical system 2 is eliminated for clarifying the drawing.

As shown in FIG. 24, in the second embodiment, the phase shift mask 4 and the substrate 6 are arranged in parallel in close proximity to each other (e.g., several μm to several-hundred μm). Furthermore, a surface of the substrate 6 is arranged so as to have an optically conjugate relationship with an exit surface of the transmission type amplitude modulation mask 1 through the first image-forming optical system 3. In the state that the transmission type amplitude modulation mask 1 is not interposed, the phase shift mask 4 has a function to convert a light beam that has a uniform light intensity distribution into a light beam that has the light intensity distribution of the inverse peak pattern, which has the light intensity that is minimum in an area corresponding to the phase shift portion 4e as shown in FIG. 7A. A widthwise dimension of the light intensity distribution of the inverse peak pattern varies in proportion to the ½ power of a distance (i.e., a defocus quantity) between the phase shift mask 4 and the substrate 6.

In the second embodiment, since the semiconductor substrate of the substrate 6 is likewise irradiated with the light beam that has the light intensity distribution of the two-stage inverse peak pattern by the effects of both the transmission type amplitude modulation mask 1 and the phase shift mask

4 like the first embodiment, the lateral growth reaches a peak from a crystal nucleus without stopping in mid course, thereby generating the crystallized semiconductor film having a large particle size. It is to be noted that the open type amplitude modulation mask 11, the converging/diverging element 12, the micro lens array 13 and the transmission filter 14 can be respectively used as modifications of the second embodiment in place of the transmission type amplitude modulation mask 1.

Figure 25:
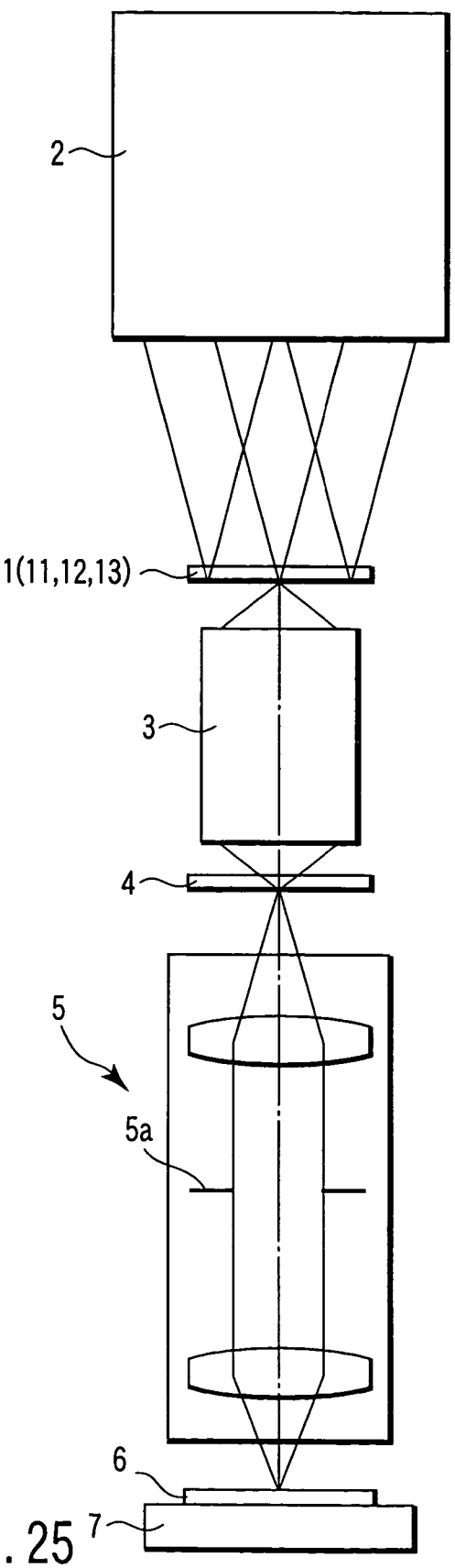
FIG. 25 is a view schematically showing a crystallization apparatus according to a third modification of the present invention.

FIG. 25 is a view schematically showing a crystallization apparatus according to a third embodiment of the present invention. Although the third embodiment has a structure similar to that of the first embodiment, the third embodiment is basically different from the first embodiment in that a phase shift surface of the phase shift mask 4 and a surface of the substrate 6 are arranged so as to have an optically conjugate relationship through the second image-forming optical system 5. The third embodiment will now be described regarding a difference from the first embodiment. It is to be noted that, in FIG. 25, the illustration of the internal structure of the illumination optical system 2 is eliminated for clarifying the drawing.

As shown in FIG. 25, the phase shift surface of the phase shift mask 4 and the surface of the substrate 6 are arranged so as to have an optically conjugate relationship through the second image-forming optical system 5. Further, the surface of the substrate 6 is arranged so as to have an optically conjugate relationship with an exit surface of the transmission type amplitude modulation mask 1 through the first image-forming optical system 3 and the second image-forming optical system 5.

The image-forming optical system 5 according to he third embodiment has an aperture diaphragm 5*a*, and is aperture diaphragm 5*a* is arranged on a pupil plane of the image-forming optical system 5. The aperture diaphragm 5*a* has a plurality of aperture diaphragms having opening portions (light transmission portions) with different sizes, and a plurality of the aperture diaphragms are configured to be converted with respect to the light path. Alternatively, the aperture diaphragm 5*a* may have an iris diaphragm which can continuously vary a size of the opening portion. The size of the opening portion of the aperture diaphragm 5*a* (i.e., an image side numerical aperture of the image-forming optical system 5) is set so as to generate a cyclic light intensity distribution of the two-stage inverse peak pattern on the semiconductor film of the substrate 6. It is preferable that a widthwise dimension of the light intensity distribution of the two-stage inverse peak pattern is set equal to a pixel pitch of the liquid crystal.

The widthwise dimension of the light intensity distribution of the inverse peak pattern formed on the semiconductor film of the substrate 6 by the effect of the phase shift mask 4 becomes substantially equivalent to a resolution R2 of the second image-forming optical system 5. Assuming that $\lambda$ is a wavelength of the light used and NA2 is the image side numerical aperture of the second image-forming optical system 5, the resolution R2 of the second image-forming optical system 5 is stipulated by $R2=k\lambda/NA2$. Here, depending on a specification of the illumination optical system 2 which illuminates the phase shift mask 4, a level of a coherence of the light beam supplied from the light source, definition of the resolution, a constant k is a value substantially close to 1. As described above, in the third embodiment, when the image side numerical aperture NA of the second image-forming optical system 5 decreases and the resolution of the second image-forming optical system 5 is lowered, the widthwise dimension of the light intensity distribution of the inverse peak pattern becomes large.

That is, the inverse peak pattern portion in the light intensity distribution of the light beam converted on the phase shift surface has a narrow widthwise dimension on the phase shift surface, and has a preferable widthwise direction on a plane distanced from the phase shift surface to some extent. In the third embodiment, since the light intensity distribution on the phase shift surface is transferred onto the semiconductor film of the substrate 6 with a low resolution by the second image-forming optical system 5, the inverse peak pattern portion in the light intensity distribution of the light beam that is applied to the substrate 6 has a preferable widthwise dimension on the semiconductor film of the substrate 6.

Furthermore, in the third embodiment, since the second image-forming optical system 5 is interposed on the optics between the phase shift mask 4 and the substrate 6 and a gap between the substrate 6 and the second image-forming optical system 5 is relatively largely assured, the phase shift mask 4 is not contaminated due to ablation of the substrate 6. Therefore, the excellent crystallization can be realized without being affected by ablation of the substrate 6.

Moreover, in the third embodiment, since a gap between the substrate 6 and the second image-forming optical system 5 is relatively largely assured, a positional relationship between the substrate 6 and the second image-forming optical system 5 can be readily adjusted by leading detection light to detect a position to the light path between the substrate 6 and the second image-forming optical system 5.

In each of the foregoing embodiments, although the phase shift mask 4 includes four rectangular areas corresponding to phases of 0, $\pi/2$, $\pi$ and $3\pi/2$, it is not restricted thereto, and various modifications of the phase shift mask 4 may be carried out. For example, it is possible to adopt a phase shift mask 4 that has an intersection (phase shift portion) by three or more phase shift lines and is set in such a manner that an integration value of a complex transmittance in a circular area with this intersection as the center is substantially zero. Further, for example, as shown in FIG. 6, it is possible to use a phase shift mask 4 which has a circular step corresponding to the phase shift portion and is set in such a manner that a phase difference between the transmission light at this circular step part and the transmission light in the circumferential area becomes $\pi$.

Although the light intensity distribution can be calculated on a design stage, it is desirable to observe and confirm the light intensity distribution on the actual processed surface (exposed surface). In order to realize this, it is good enough to enlarge the processed surface by the optical system and input a result by an imaging element such as a CCD. When the light to be used is an ultraviolet ray, since the optical system is restricted, it is possible to provide a fluorescent screen to the processed surface and convert the light into visible light.

Figure 27A:
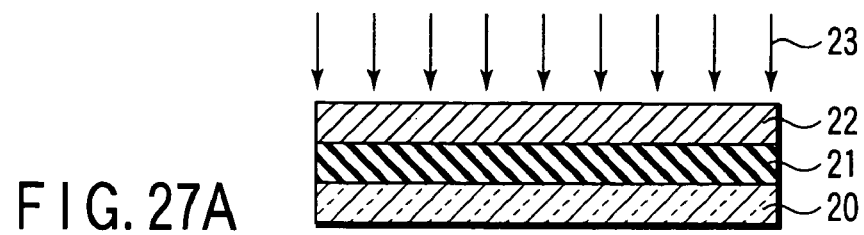
FIGS. 27A to 27E show steps of manufacturing an electronic device by using the crystallization apparatus according to each embodiment.

FIGS. 27A to 27E show steps of manufacturing an electronic device by using the crystallization apparatus according to each embodiment. As shown in FIG. 27A, the substrate 6 is prepared by forming an underlying film 21 (e.g., SiN having a film thickness of 50 nm, an $SiO_2$ laminated film having a film thickness of 100 nm, and others) and an amorphous semiconductor film 22 (e.g., Si, Gc, SiGe or the like having a film thickness of approximately 50 nm to 200 nm) on an insulating substrate 20 (e.g., alkaline glass, quartz glass, plastic, polyimide and others) by, e.g., a chemical vapor deposition method or a sputtering method.

Figure 27B:
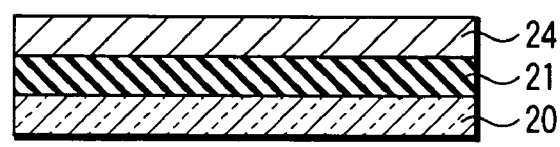

A part or all of the surface of the formed amorphous semiconductor film 22 is irradiated with a laser beam 23 (e.g., a KrF excimer laser beam or an XeCl excimer laser beam) by using the above-described crystallization apparatus. Since the crystallization apparatus according to each embodiment of the present invention provides the light beam that has the light intensity distribution of the two-stage inverse peak pattern, a polycrystalline semiconductor film or a monocrystalline semiconductor film 24 having a crystal with a larger particle size than that of a polycrystalline semiconductor film produced by the conventional crystallization apparatus is produced as shown in FIG. 27B.

When the amorphous semiconductor film 22 has a relatively large surface and only a part of the surface is irradiated by one radiation with the crystallization apparatus, crystallization of the entire surface of the amorphous semiconductor film 22 can be carried out by moving the crystallization apparatus and the amorphous semiconductor film 22 relatively in two orthogonal directions.

For example, the crystallization apparatus may be able to move in two orthogonal directions with respect to the amorphous semiconductor film 22, and the surface of the amorphous semiconductor 22 may be irradiated with the light beam while moving the crystallization apparatus by moving this stage with respect to the fixed crystallization apparatus. Alternatively, the substrate to which the amorphous semiconductor film 22 is provided may be mounted on a stage which can move in two orthogonal directions, and the surface of the amorphous semiconductor film 22 may be irradiated with the light beam. Alternatively, in the crystallization apparatus that the substrate to which the amorphous semiconductor film 22 is provided in a direction orthogonal to the crystallization apparatus supported by an arm capable of moving in only one direction is moved with respect to this crystallization apparatus, the surface of the amorphous semiconductor film 22 may be irradiated with the light beam by relatively moving the crystallization apparatus and the substrate in two directions orthogonal to each other.

Figure 27C:
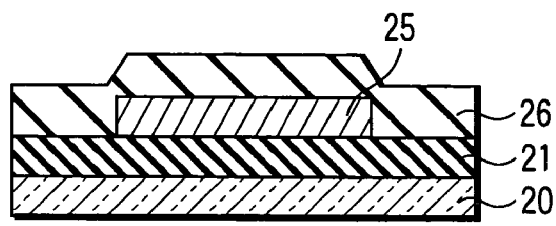
Figure 27D:
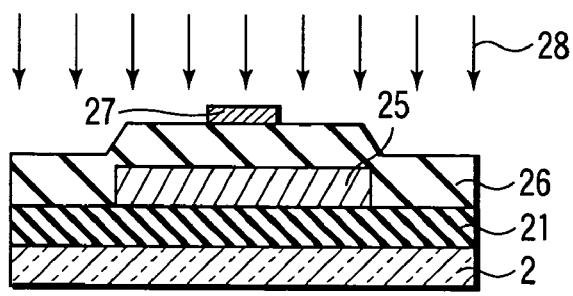

Then, as shown in FIG. 27C, a polycrystalline semiconductor film or a monocrystalline semiconductor film 24 is processed into an island-shaped semi-conductor film 25 by using a photolithography technique, and an $SiO_2$ film having a film thickness of 20 nm to 100 nm is formed as a gate insulting film 26 by the chemical vapor deposition method, the sputtering method or the like. Moreover, as shown in FIG. 27D, a gate electrode 27 (e.g., silicide or MoW) is formed, and impurity ions 28 (phosphor in case of an N channel transistor, and boron in case of a P channel transistor) are injected with the gate electrode 27 being used as a mask. Thereafter, annealing processing (e.g., one hour at 450° C.) is carried out in a nitrogen atmosphere, and the impurities are activated.

Figure 27E:
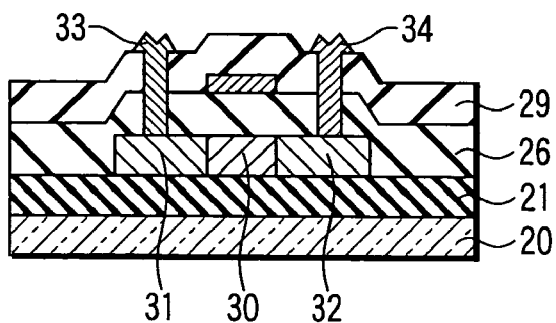

Then, as shown in FIG. 27E, an interlayer insulating film 29 is formed, a contact hole is formed, and a source electrode 33 and a drain electrode 34 which are connected to a source 31 and a grain 32 coupled to each other by a channel 30 are formed. At this moment, the channel 30 is formed in accordance with a position of the large-particle-size crystal of the polycrystalline semiconductor film or the monocrystalline semiconductor film 24 produced in the steps shown in FIGS. 27A and 27B.

By the above-described steps, the polycrystalline transistor or the monocrystalline semiconductor transistor can be formed. The thus manufactured thin film transistor can be applied to a drive circuit of a display apparatus such as a liquid crystal display or an EL (electroluminescence) display, an integrated circuit such as a memory (SRAM or DRAM) or CPU, and others.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization apparatus, which includes an illumination system that illuminates a phase shift mask to irradiate a polycrystalline semiconductor film or an amorphous semiconductor film with a light beam that has a light intensity distribution of an inverse peak pattern that has a minimum light intensity in an area corresponding to a phase shift portion of the phase shift mask to produce a crystallized semiconductor film, comprising:
   an optical member to form on a predetermined plane a light intensity distribution of a concave pattern, which has a light intensity that is minimum in an area corresponding to the phase shift portion and increases toward the circumference of that area to a maximum based on the light from the illumination system, the phase shift mask receiving the light intensity distribution from the optical member; and
   an image-forming optical system to set a surface of the polycrystalline semiconductor film or the amorphous semiconductor film or its conjugate plane and the predetermined plane to an optical conjugate relationship.

2. The crystallization apparatus according to claim 1, wherein the optical member has a transmission type amplitude modulation mask having a transmittance distribution according to the light intensity distribution having the concave pattern to be formed on the predetermined plane.

3. The crystallization apparatus according to claim 2, wherein the transmission type amplitude modulation mask has a light transmission portion having a fixed thickness, and a light absorption portion having a thickness distribution according to the light intensity distribution having the concave pattern to be formed on the predetermined plane.

4. The crystallization apparatus according to claim 3, wherein the light absorption portion has a sinusoidal surface.

5. The crystallization apparatus according to claim 4, wherein the sinusoidal surface is formed into a continuously curved shape or a step-like shape.

6. The crystallization apparatus according to claim 1, wherein the optical member is an open type amplitude modulation mask having a numerical aperture distribution according to the light intensity distribution having the concave pattern to be formed on the predetermined plane.

7. The crystallization apparatus according to claim 6, wherein the open type amplitude modulation mask has many minute transmission areas or many minute light shielding areas or both.

8. The crystallization apparatus according to claim 7, wherein sizes of the minute transmission area and the minute light shielding area are set to be substantially smaller than a resolution of the image forming optical system.

9. The crystallization apparatus according to claim 8, wherein the image-forming optical system is a reduction optical system.

10. The crystallization apparatus according to claim 1, wherein, on the predetermined plane, the optical member is a converging/diverging element that produces an area that is illuminated with a part of the light beam is diverged in accordance with the phase shift portion and an area that is illuminated with a part of the light beam is converged in accordance with the circumference of the phase shift portion.

11. The crystallization apparatus according to claim 10, wherein the converging/diverging element has a diverging refraction surface to diverge a part of the light beam and a converging refraction surface to converge a part of the light beam.

12. The crystallization apparatus according to claim 11, wherein the diverging refraction surface and the converging refraction surface form a sinusoidal refraction surface.

13. The crystallization apparatus according to claim 12, wherein the sinusoidal refraction surface is formed into a continuous curved shape or a step-like shape.

14. The crystallization apparatus according to claim 1, wherein the optical member comprises a light intensity distribution formation element to form a predetermined light intensity distribution having a light intensity that is larger at the circumference rather than a center on a pupil plane of the illumination system or in the vicinity thereof, and a wavefront splitting element to wavefront-split a light beam supplied from the illumination system into a plurality of light beams and converge each wavefront-split light beam in an area corresponding to the phase shift portion on the predetermined plane.

15. The crystallization apparatus according to claim 14, wherein the wavefront splitting element has a plurality of optical elements having a converging function.

16. The crystallization apparatus according to claim 14 or claim 15, wherein the predetermined light intensity distribution has a circular central area, which has a relatively small light intensity, and a toric peripheral area, which is formed so as to surround the central area and has a relatively large light intensity.

17. The crystallization apparatus according to claim 14 or claim 15, wherein the predetermined light intensity distribution has a central area, which is elongated along a predetermined direction and has a relatively small light intensity, and a peripheral area, which is formed so as to surround or sandwich the central area and has a relatively large light intensity.

18. The crystallization apparatus according to claim 14, wherein the light intensity distribution formation element has a transmission filter having a predetermined light transmittance distribution, which is arranged on the illumination pupil plane or in the vicinity thereof.

19. The crystallization apparatus according to claim 1, wherein a phase shift surface of the phase shift mask is formed on a surface on a side opposite to the illumination system side.

20. The crystallization apparatus according to claim 1, wherein the light intensity distribution that is applied to the polycrystalline semiconductor film or the amorphous semiconductor film has an inverse peak pattern area that has a minimum light intensity in an area corresponding to the phase shift portion of the phase shift mask, and a concave pattern area, which has the light intensity increases from the inverse peak pattern area toward the circumference, and has an inflection point where an inclination decreases toward the circumference between the inverse peak pattern area and the concave pattern area.

21. The crystallization apparatus according to claim 1, wherein the polycrystalline semiconductor film or the amorphous semiconductor film and the phase shift mask are arranged parallel to each other and in close proximity to each other.

22. The crystallization apparatus according to claim 1, further comprising a second image-forming optical system arranged in a light path between the polycrystalline semiconductor film or the amorphous semiconductor film and the phase shift mask,
wherein a surface of the polycrystalline semiconductor film or the amorphous semiconductor film is set apart from a plane that is optically conjugate with the phase shift mask through the second image-forming optical system along an optical axis by a predetermined distance.

23. The crystallization apparatus according to claim 1, further comprising a second image-forming optical system arranged in a light path between the polycrystalline semiconductor film or the amorphous semiconductor film and the phase shift mask,
wherein a surface of the polycrystalline semiconductor film or the amorphous semiconductor film is set to a plane optically conjugate with the phase shift mask through the second image-forming optical system, and
an image side numerical aperture of the second image-forming optical system is set to a value required to generate the light intensity distribution having the inverse peak pattern.

24. A crystallization method, which illuminates a phase shift mask to irradiate a polycrystalline semiconductor film or an amorphous semiconductor film with a light beam that has a light intensity distribution of an inverse peak pattern, which has a light intensity that is minimum in an area corresponding to a phase shift portion of the phase shift mask to produce a crystallized semiconductor film, comprising:
forming on a predetermined plane a light intensity distribution having a concave pattern that has a light intensity that becomes minimum in an area corresponding to the phase shift portion and increases toward the circumference of that area to a maximum based on the light from the illumination system, the phase shift mask receiving the light intensity distribution from the optical member; and
setting a surface of the polycrystalline semiconductor film or the amorphous semiconductor film or its conjugate plane and the predetermined plane to an optically conjugate relationship through the image-forming optical system.

25. The crystallization method according to claim 24, wherein the polycrystalline semiconductor film or the amorphous semiconductor film and the phase shift mask are arranged parallel to each other and in close proximity to each other.

26. The crystallization method according to claim 24, wherein a second image-forming optical system is arranged in a light path between the polycrystalline semiconductor film or the amorphous semiconductor film and the phase shift mask, and
a surface of the polycrystalline semiconductor film or the amorphous semiconductor film is set apart from a plane that is optically conjugate with the phase shift mask along an optical axis by a predetermined distance.

27. The crystallization method according to claim 24, wherein a second image-forming optical system is arranged in a light path between the polycrystalline semiconductor film or the amorphous semiconductor film and the phase shift mask, an image side numerical aperture of the second image-forming optical system is set to a value required to generate the light intensity distribution having the inverse peak pattern, and the surface of the polycrystalline semiconductor film or the amorphous semiconductor film is set to a plane that is optically conjugate with the phase shift mask through the second image-forming optical system.

28. A thin film transistor manufactured by the crystallization method according to claim 24.

29. A display apparatus including the thin film transistor according to claim 28.

30. A crystallization apparatus, which includes an illumination system that illuminates a phase shift mask to irradiate a polycrystalline semiconductor film or an amorphous semiconductor film with a light beam that has a light intensity distribution of an inverse peak pattern that has a minimum light intensity in an area corresponding to a phase shift portion of the phase shift mask to produce a crystallized semiconductor film, comprising:

an optical member to form on a predetermined plane a light intensity distribution of a concave pattern, which has a light intensity that is minimum at the center and increases toward the circumference to a maximum based on the light from the illumination system, the phase shift mask receiving the light intensity distribution from the optical member; and an image-forming optical system to set a surface of the polycrystalline semiconductor film or the amorphous semiconductor film or its conjugate plane and the predetermined plane to an optical conjugate relationship.

31. A crystallization method, which illuminates a phase shift mask to irradiate a polycrystalline semiconductor film or an amorphous semiconductor film with a light beam that has a light intensity distribution of an inverse peak pattern, which has a light intensity that is minimum in an area corresponding to a phase shift portion of the phase shift mask to produce a crystallized semiconductor film, comprising:

forming on a predetermined plane a light intensity distribution having a concave pattern that has a light intensity that is minimum at the center and increases toward the circumference based on the light from the illumination system, the phase shift mask receiving the light intensity distribution from the optical member; and setting a surface of the polycrystalline semiconductor film or the amorphous semiconductor film or its conjugate plane and the predetermined plane to an optically conjugate relationship through the image-forming optical system.

* * * * *